(12) United States Patent
Kwon et al.

(10) Patent No.: US 11,270,606 B2
(45) Date of Patent: *Mar. 8, 2022

(54) DISPLAY DEVICE

(71) Applicant: LG Display Co., Ltd., Seoul (KR)

(72) Inventors: Hoiyong Kwon, Seoul (KR); JiHun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/990,200

(22) Filed: Aug. 11, 2020

(65) Prior Publication Data

US 2021/0074189 A1    Mar. 11, 2021

(30) Foreign Application Priority Data

Sep. 6, 2019  (KR) ........................ 10-2019-0110631

(51) Int. Cl.
| | |
|---|---|
| *G06F 1/16* | (2006.01) |
| *G09F 9/30* | (2006.01) |
| *H05K 5/00* | (2006.01) |
| *H05K 5/02* | (2006.01) |

(52) U.S. Cl.
CPC ............ *G09F 9/301* (2013.01); *G06F 1/1652* (2013.01); *H05K 5/0017* (2013.01); *H05K 5/0217* (2013.01); *H05K 2201/10128* (2013.01)

(58) Field of Classification Search
CPC ..... G09F 9/301; G06F 1/1652; H05K 5/0017; H05K 5/0217; H05K 2201/10128
See application file for complete search history.

(56) References Cited

U.S. PATENT DOCUMENTS

| | | | |
|---|---|---|---|
| 9,684,340 B2 * | 6/2017 | Han | ..................... G09G 3/3233 |
| 9,747,822 B2 * | 8/2017 | Lee | ..................... G09F 15/0056 |
| 2008/0049003 A1 * | 2/2008 | Hasegawa | ............. G06F 1/1683 |
| | | | 345/206 |

(Continued)

FOREIGN PATENT DOCUMENTS

| | | |
|---|---|---|
| EP | 3770890 A1 | 1/2021 |
| GB | 2577401 A | 3/2020 |

(Continued)

OTHER PUBLICATIONS

Combined Search and Examination report dated Feb. 12, 2021, issued in corresponding UK Patent Application No. GB2013609.9.

*Primary Examiner* — Hung S. Bui
*Assistant Examiner* — Sagar Shrestha
(74) *Attorney, Agent, or Firm* — Morgan, Lewis & Bockius LLP

(57) ABSTRACT

A display device includes a display panel, a first back cover which supports the display panel on a rear surface of the display panel; at least one flexible film which is electrically connected to a lower end of a rear surface of the display panel and is disposed on a rear surface of the first back cover; a printed circuit board which is electrically connected to the flexible film and disposed on the rear surface of the first back cover; a cover unit which accommodates the flexible films and the printed circuit board on the rear surface of the first back cover; and a roller around which the display panel and the first back cover are wound or unwound. Accordingly, a pad crack caused by a tension of the plurality of flexible films may be improved.

15 Claims, 29 Drawing Sheets

(56) References Cited

U.S. PATENT DOCUMENTS

| | | | |
|---|---|---|---|
| 2008/0247126 A1* | 10/2008 | Otsuka | G06F 1/1601 |
| | | | 361/679.06 |
| 2015/0227171 A1* | 8/2015 | Choi | G06F 1/1652 |
| | | | 361/749 |
| 2016/0155965 A1* | 6/2016 | Kusu | H01L 51/0024 |
| | | | 361/749 |
| 2016/0161983 A1* | 6/2016 | Lee | G06F 1/1652 |
| | | | 361/749 |
| 2016/0239050 A1* | 8/2016 | Kim | G06F 1/1652 |
| 2016/0363960 A1* | 12/2016 | Park | G09F 9/301 |
| 2016/0374228 A1* | 12/2016 | Park | H05K 7/16 |
| 2017/0013726 A1* | 1/2017 | Han | H05K 5/03 |
| 2017/0031388 A1* | 2/2017 | Han | G09G 3/3233 |
| 2017/0156219 A1* | 6/2017 | Heo | H01L 51/0097 |
| 2017/0318688 A1* | 11/2017 | Kim | G06F 1/1652 |
| 2017/0318692 A1* | 11/2017 | Lee | G06F 1/1658 |
| 2017/0367198 A1* | 12/2017 | Park | H01L 51/5237 |
| 2018/0070466 A1* | 3/2018 | Kim | H05K 5/0217 |
| 2018/0070467 A1* | 3/2018 | Kim | H01L 51/0097 |
| 2020/0008308 A1* | 1/2020 | Shin | H05K 5/03 |
| 2020/0093011 A1 | 3/2020 | Lee et al. | |
| 2020/0154580 A1* | 5/2020 | Shin | G06F 1/1654 |
| 2021/0029839 A1 | 1/2021 | Kwon et al. | |

FOREIGN PATENT DOCUMENTS

| | | |
|---|---|---|
| KR | 10-2017-0006013 A | 1/2017 |
| KR | 10-20170040864 A | 4/2017 |
| KR | 10-101945985 B1 | 2/2019 |
| KR | 10-2020-0031947 A | 3/2020 |

\* cited by examiner

DISPLAY DEVICE

CROSS-REFERENCE TO RELATED APPLICATIONS

This application claims the priority of Korean Patent Application No. 10-2019-0110631 filed on Sep. 6, 2019, in the Korean Intellectual Property Office, the disclosure of which is incorporated herein by reference.

BACKGROUND

Technical Field

The present disclosure relates to a display device, and more particularly, to a rollable display device which is capable of displaying images even in a rolled state.

Discussion of the Related Art

As display devices which are used for a monitor of a computer, a television, or a cellular phone, there are an organic light emitting display device OLED which is a self-emitting device, a liquid crystal display device LCD which requires a separate light source, and the like.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even though the display device is rolled is getting attention as a next generation display device.

SUMMARY

Accordingly, embodiments of the present disclosure are directed to a display device that substantially obviates one or more of the problems due to limitations and disadvantages of the related art.

An object of the present disclosure is to provide a display device which consistently maintains a shape of a flexible film even during the repeated winding and unwinding.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device includes a display panel, a first back cover which supports the display panel on a rear surface of the display panel, at least one flexible film which is electrically connected to a lower end of a rear surface of the display panel and is disposed on a rear surface of the first back cover, a printed circuit board which is electrically connected to the flexible film and disposed on the rear surface of the first back cover, a cover unit which accommodates the flexible films and the printed circuit board on the rear surface of the first back cover, and a roller around which the display panel and the first back cover are wound or unwound.

Other detailed matters of the exemplary embodiments are included in the detailed description and the drawings.

According to the present disclosure, the shape of the flexible film is consistently maintained even during the repeated winding and unwinding, so that the crack of the pad area due to the tension of the flexible film may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
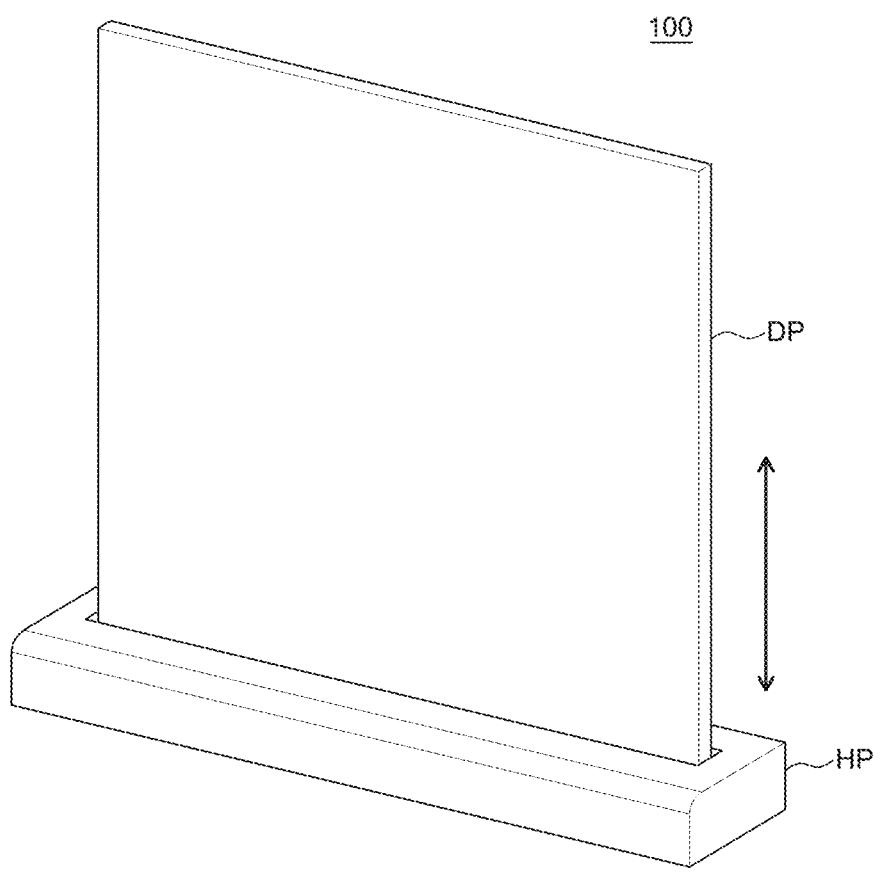
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

<Display Device—Rollable Display Device>

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
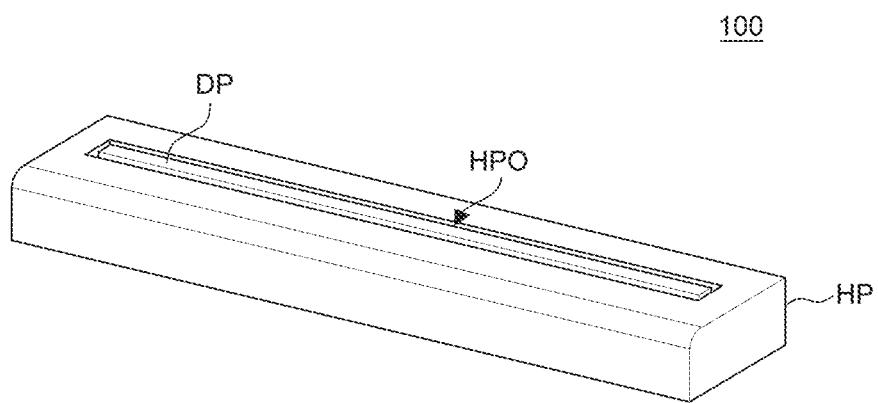

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed.

Since the display device 100 according to the exemplary embodiment of the present disclosure is a rollable display device, the display unit DP may be configured to be wound or unwound. The display unit DP may be configured by a display panel and a back cover which have flexibility to be wound or unwound. The display unit DP will be described below in more detail with reference to FIGS. 4 to 6.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move in a vertical direction by passing through the opening HPO of the housing unit HP.

The display unit DP may be switched from a fully unwound state to a fully wound state or from a fully wound state to a fully unwound state.

FIG. 1A illustrates a fully unwound state of the display unit DP of the display device 100 and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound, it may be defined as a fully unwound state.

FIG. 1B illustrates a fully wound state of the display unit DP of the display device 100 and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In order to switch the display unit DP to a fully unwound state or a fully wound state, a driving unit which winds or unwinds the display unit DP may be disposed.

<Driving Unit>

Figure 2:
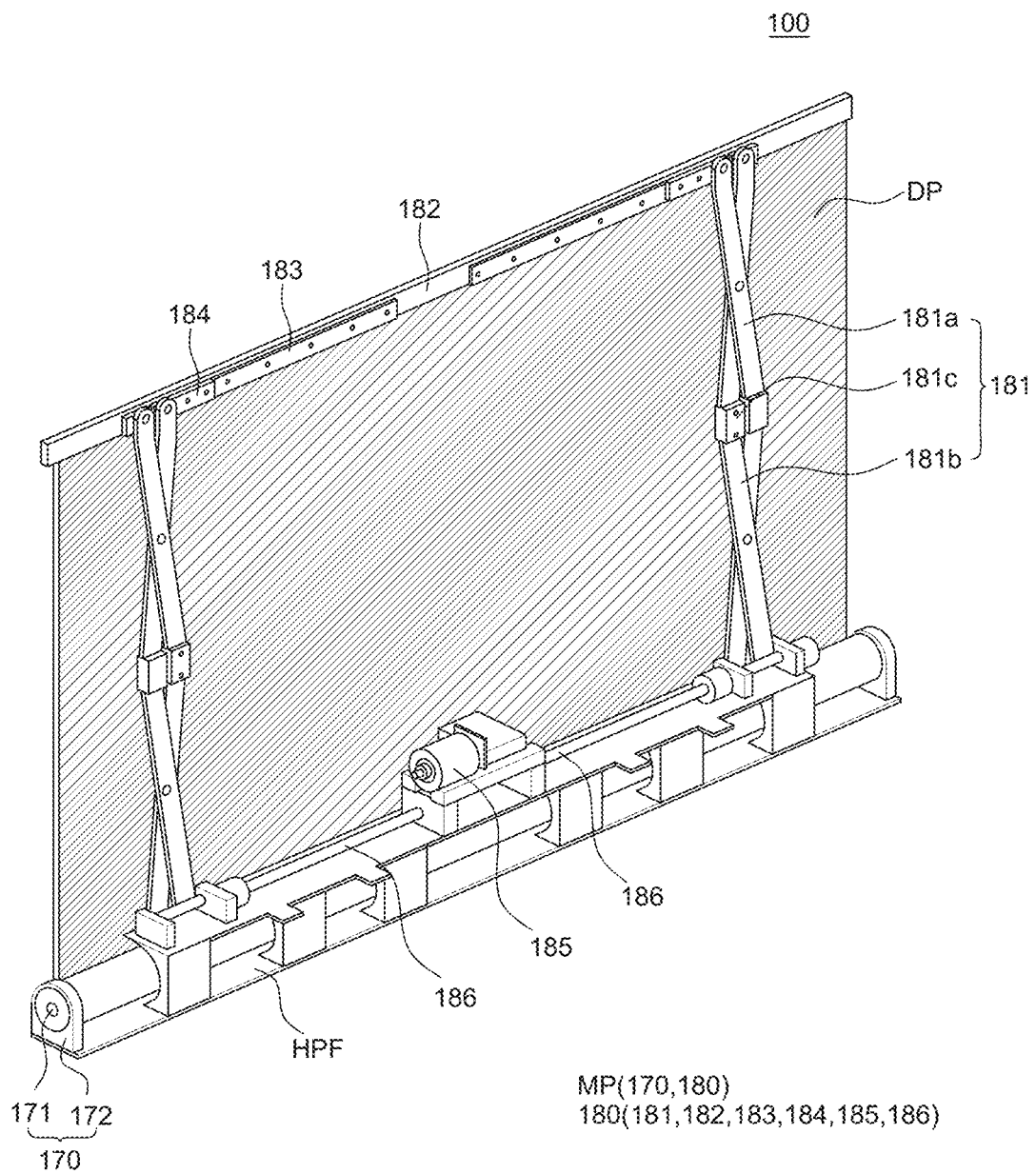
FIG. 2 is a perspective view of a display device according to an exemplary embodiment of the present disclosure.

FIG. 2 is a perspective view of a display device according to an exemplary embodiment of the present disclosure.

Figure 3:
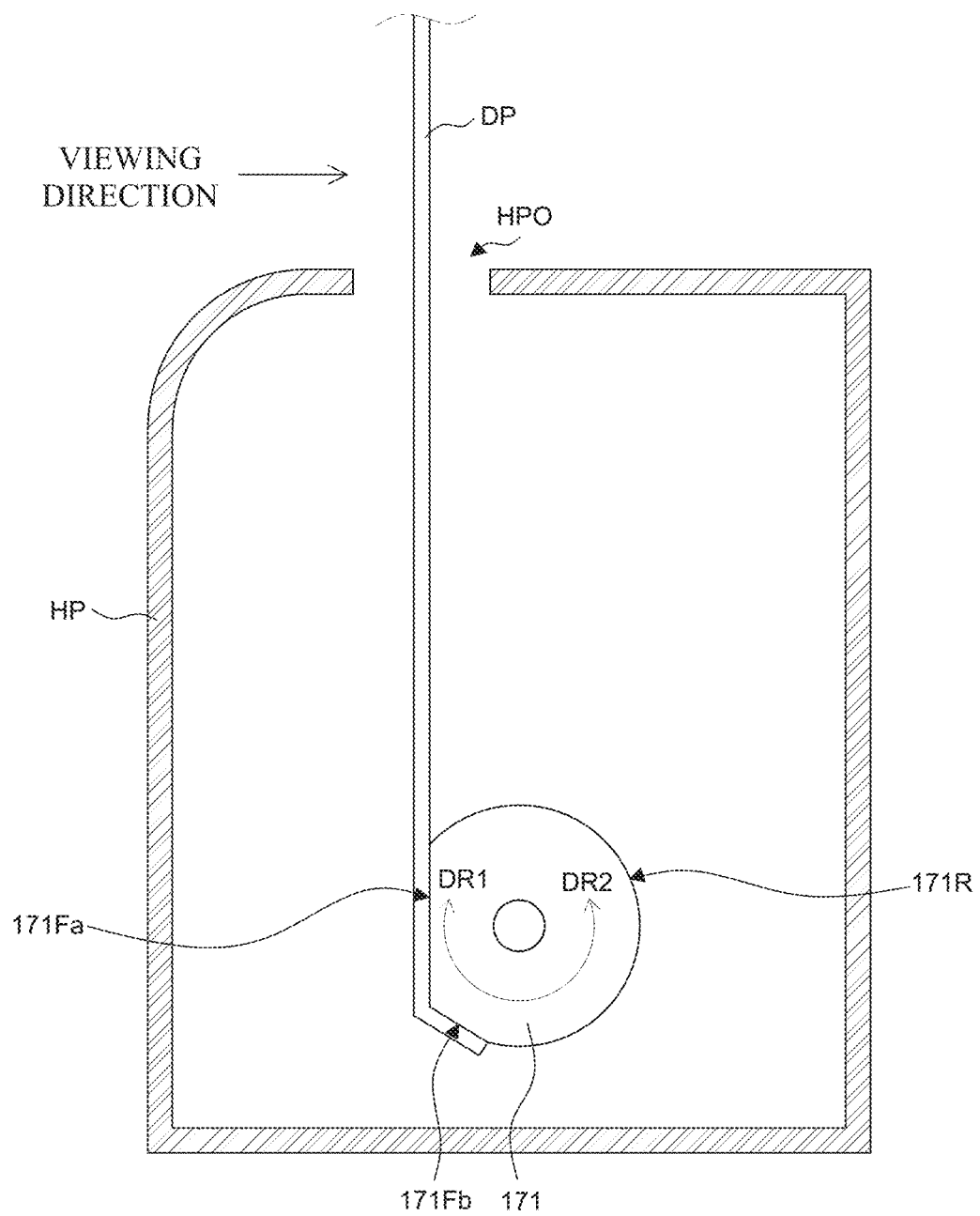
FIG. 3 is a schematic cross-sectional view of a display device according to an exemplary embodiment of the present disclosure.

FIG. 3 is a schematic cross-sectional view of a display device according to an exemplary embodiment of the present disclosure. FIG. 3 is a schematic cross-sectional view for explaining a roller 171 and a display unit DP of a display device 100 according to an exemplary embodiment of the present disclosure. For the convenience of description, in FIG. 3, only a housing unit HP, a roller 171, and a display unit DP are illustrated.

First, referring to FIG. 2, a driving unit MP includes a roller unit 170 and a lifting unit 180.

The roller unit 170 rotates in a clockwise direction or a counterclockwise direction to wind or unwind the display unit DP fixed to the roller unit 170. The roller unit 170 includes a roller 171 and a roller support unit 172.

The roller 171 is a member around which the display unit DP is wound. The roller 171 may be, for example, formed to have a cylindrical shape. A lower edge of the display unit DP may be fixed to the roller 171. When the roller 171 rotates, the display unit DP which is fixed to the roller 171 through the lower edge may be wound around the roller 171. In contrast, when the roller 171 rotates in an opposite direction, the display unit DP which is wound around the roller 171 may be unwound from the roller 171.

Referring to FIG. 3, the roller 171 may be formed to have a cylindrical shape in which at least a part of an outer circumferential surface of the roller 171 is flat and the remaining part of the outer circumferential surface is a curved portion. Even though the roller 171 may be entirely a cylindrical shape, a part may be formed of a flat surface. That is, a part of the outer circumferential surface of the roller 171 may be formed to be flat and the remaining part of the outer circumferential surface may be formed to be a curved surface. For example, the roller 171 may be configured by a curved portion 171R, a first flat portion 171Fa, and a second flat portion 171Fb. In this case, in the first flat portion 171Fa and the second flat portion 171Fb of the roller 171, the plurality of flexible films 130 of the display unit DP and the printed circuit board 140 are seated, respectively. However, the roller 171 may have a complete cylindrical shape or an arbitrary shape which may wind the display unit DP but is not limited thereto. A winding process of the roller 171 configured by a flat portion 171F, a first curved portion 171Ra, and a second curved portion 171Rb and the display unit DP will be described below with reference to FIGS. 9A to 9D.

Referring to FIG. 2 again, the roller support unit 172 may support the roller 171 at both sides of the roller 171. Specifically, the roller support unit 172 is disposed on a bottom surface HPF of the housing unit HP and an upper side surface of the roller support unit 172 may be coupled to both side ends of the roller 171. By doing this, the roller support unit 172 may support the roller 171 to be spaced apart from the bottom surface HPF of the housing unit HP. The roller 171 may be rotatably coupled to the roller support unit 172.

The lifting unit 180 may move the display unit DP in a vertical direction in accordance with the driving of the roller unit 170. The lifting unit 180 may include a link unit 181, a head bar 182, a slide rail 183, a slider 184, a motor 185, and a rotary unit 186.

The link unit 181 of the lifting unit 180 may include a plurality of links 181a and 181b and a hinge unit 181c which connects the plurality of links 181a and 181b to each other. Specifically, the plurality of links 181a and 181b may include a first link 181a and a second link 181b and the first link 181a and the second link 181b cross each other in the form of scissors to be rotatably fastened by means of the hinge unit 181c. When the link unit 181 moves in the vertical direction, the plurality of links 181a and 181b may rotate to be far away from each other or close to each other, respectively.

The head bar 182 of the lifting unit 180 may be fixed to an uppermost end of the display unit DP. The head bar 182 is coupled to the link unit 181 to move the display unit DP in the vertical direction in accordance with the rotation of the plurality of links 181a and 181b of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on a top surface of the display unit DP. The display unit DP and the head bar 182 may be fixed by a screw but are not limited thereto.

The slide rail 183 of the lifting unit 180 may provide a movement path of the plurality of links 181a and 181b. Some of the plurality of links 181a and 181b are rotatably fastened with the slide rail 183 so that the motion may be guided along a trajectory of the slide rail 183. Some of the plurality of links 181a and 181b may be fastened with the slider 184 which is movably provided along the slide rail 183 to move along a trajectory of the slide rail 183.

The motor 185 is connected to a power generating unit, such as a separate external power source or a built-in battery, to be supplied with the power. The motor 185 generates a torque to provide a driving force to the rotary unit 186.

The rotary unit 186 is connected to the motor 185 to be configured to convert a rotational motion from the motor 185 into a linear reciprocating motion. That is, the rotational motion of the motor 185 may be converted into the linear reciprocating motion of a structure fixed to the rotary unit 186. For example, the rotary unit 186 may be implemented by a shaft and a ball screw including a nut which is fastened with the shaft but is not limited thereto.

The motor 185 and the rotary unit 186 interwork with the link unit 181 to lift and lower the display unit DP. The link unit 181 is formed with a link structure to receive the driving force from the motor 185 and the rotary unit 186 to be repeatedly folded or unfolded.

When the display unit DP is wound, the motor 185 is driven so that the structure of the rotary unit 186 may perform the linear motion. That is, a part of the rotary unit 186 to which one end of the second link 181b is coupled may perform the linear motion. Therefore, one end of the second link 181b may move to the motor 185 and the plurality of links 181a and 181b is folded so that the height of the link unit 181 may be reduced. Further, while the plurality of links 181a and 181b is folded, the head bar 182 coupled to the first link 181a is also lowered and one end of the display unit DP coupled to the head bar 182 is also lowered.

When the display unit DP is unwound, the motor 185 is driven so that the structure of the rotary unit 186 may perform the linear motion. That is, a part of the rotary unit 186 to which one end of the second link 181b is coupled may perform the linear motion. Therefore, one end of the second link 181b may move to be away from the motor 185 and the plurality of links 181a and 181b is unfolded so that the height of the link unit 181 may be increased. Further, when the plurality of links 181*a* and 181*b* is unfolded, the head bar 182 coupled to the first link 181*a* is also lifted and one end of the display unit DP coupled to the head bar 182 is also lifted.

Accordingly, when the display unit DP is fully wound around the roller 171, the link unit 181 of the lifting unit 180 may maintain a folded state. That is, when the display unit DP is fully wound around the roller 171, the lifting unit 180 may have a smallest height. When the display unit DP is fully unwound, the link unit 181 of the lifting unit 180 may maintain an unfolded state. That is, when the display unit DP is fully unwound, the lifting unit 180 may have a largest height.

When the display unit DP is wound, the roller 171 may rotate and the display unit DP may be wound around the roller 171. For example, referring to FIG. 3, a lower edge of the display unit DP may be coupled to the roller 171. When the roller 171 rotates in a second direction DR2, that is, a counterclockwise direction, the display unit DP may be wound while a rear surface of the display unit DP is in close contact with the top surface of the roller 171.

On the other hand, when the display unit DP is unwound, the roller 171 may rotate and the display unit DP may be unwound from the roller 171. For example, referring to FIG. 3, when the roller 171 rotates in a first direction DR1, that is, in a clockwise direction, the display unit DP which is wound around the roller 171 is unwound from the roller 171 to be disposed at the outside of the housing unit HP.

In some exemplary embodiments, a driving unit MP having another structure other than the above-described driving unit MP may be applied to the display device 100. That is, as long as the display unit DP is wound and unwound, the above-described configuration of the roller unit 170 and the lifting unit 180 may be modified, some configurations may be omitted, or another configuration may be added.

<Display Unit>

Figure 4:
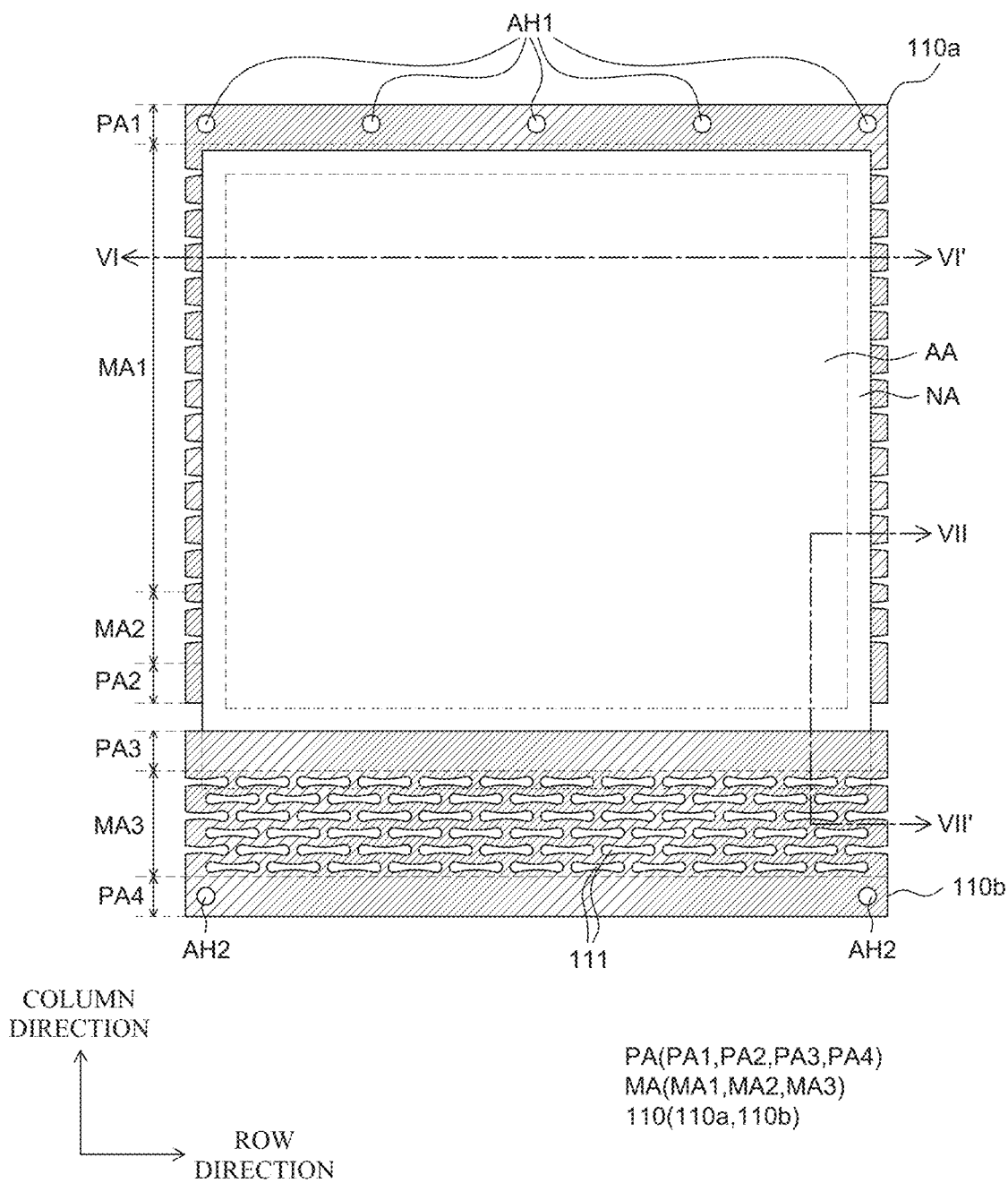
FIG. 4 is a plan view of a display unit of a display device according to an exemplary embodiment of the present disclosure.

FIG. 4 is a plan view of a display unit of a display device according to an exemplary embodiment of the present disclosure.

Figure 5:
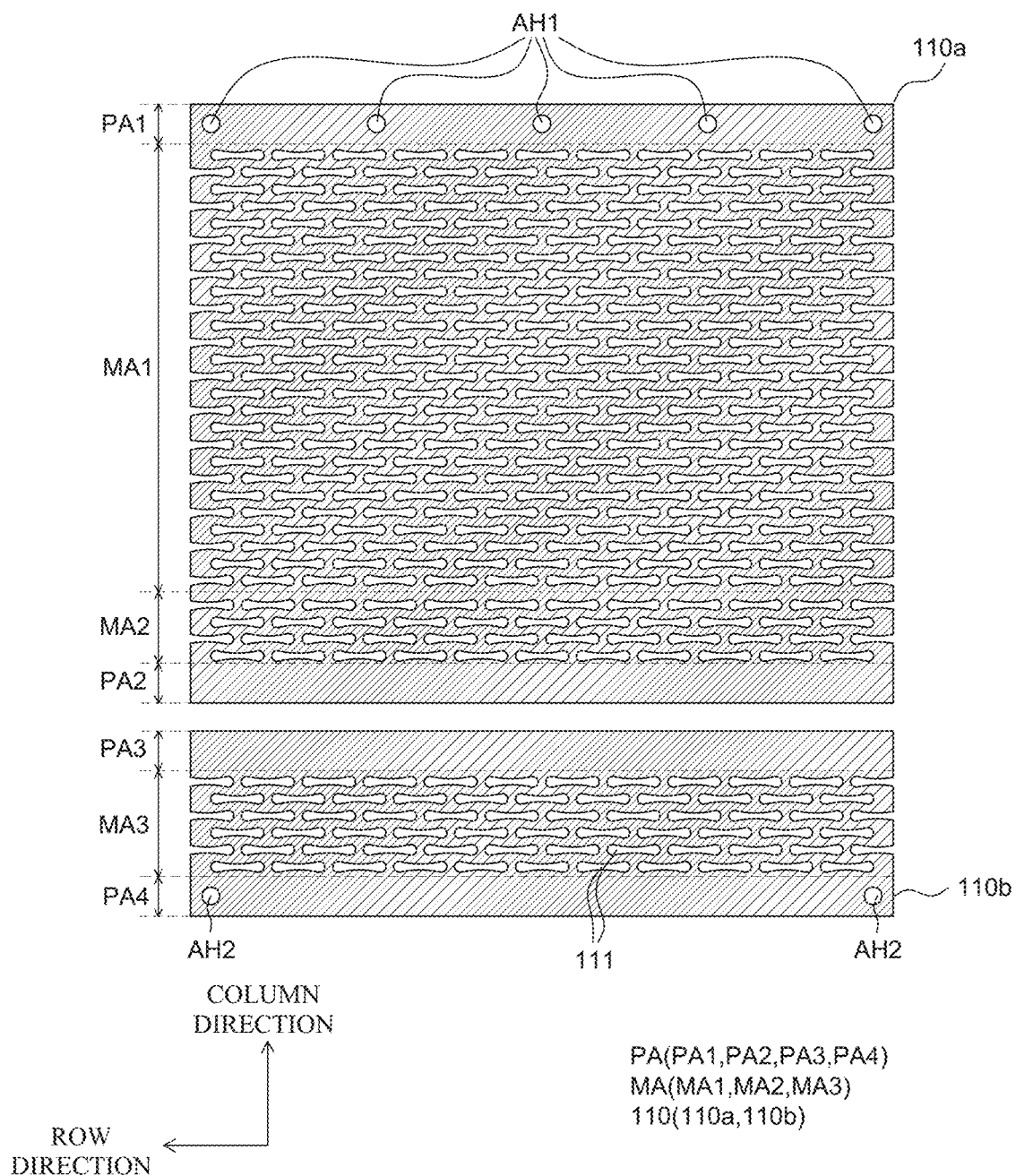
FIG. 5 is a plan view of a display unit of a display device according to an exemplary embodiment of the present disclosure.

FIG. 5 is a plan view of a display unit of a display device according to an exemplary embodiment of the present disclosure.

Figure 6:
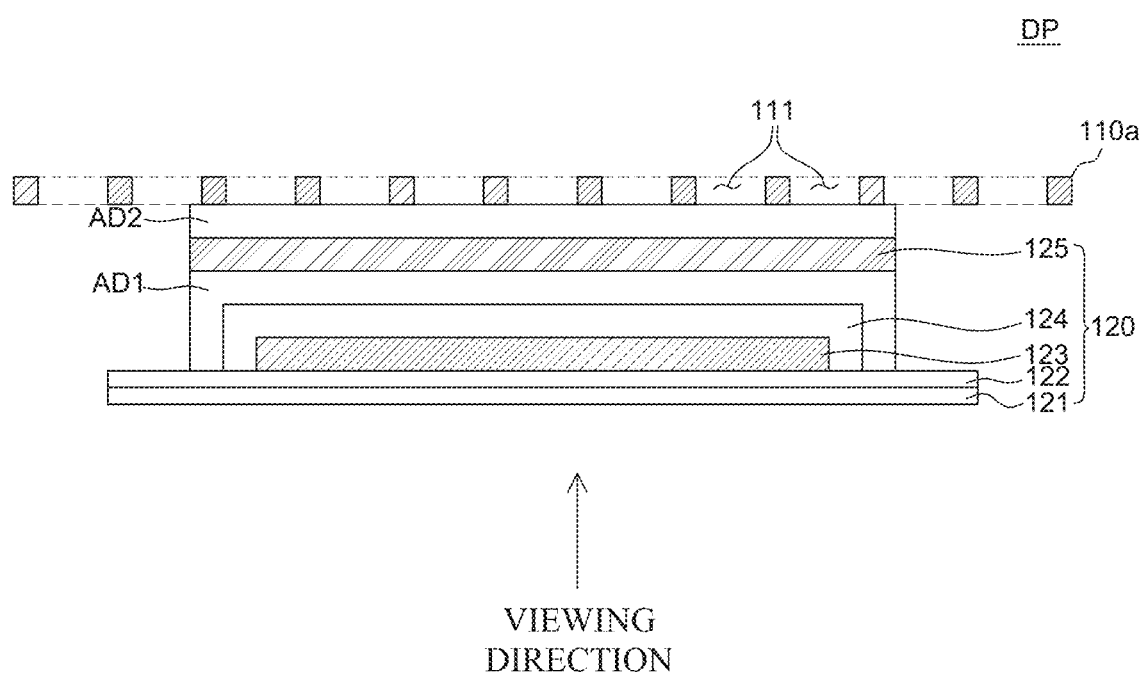
FIG. 6 is a cross-sectional view taken along the line VI-VI' of FIG. 4.

FIG. 6 is a cross-sectional view taken along the line VI-VI' of FIG. 4.

Figure 7:
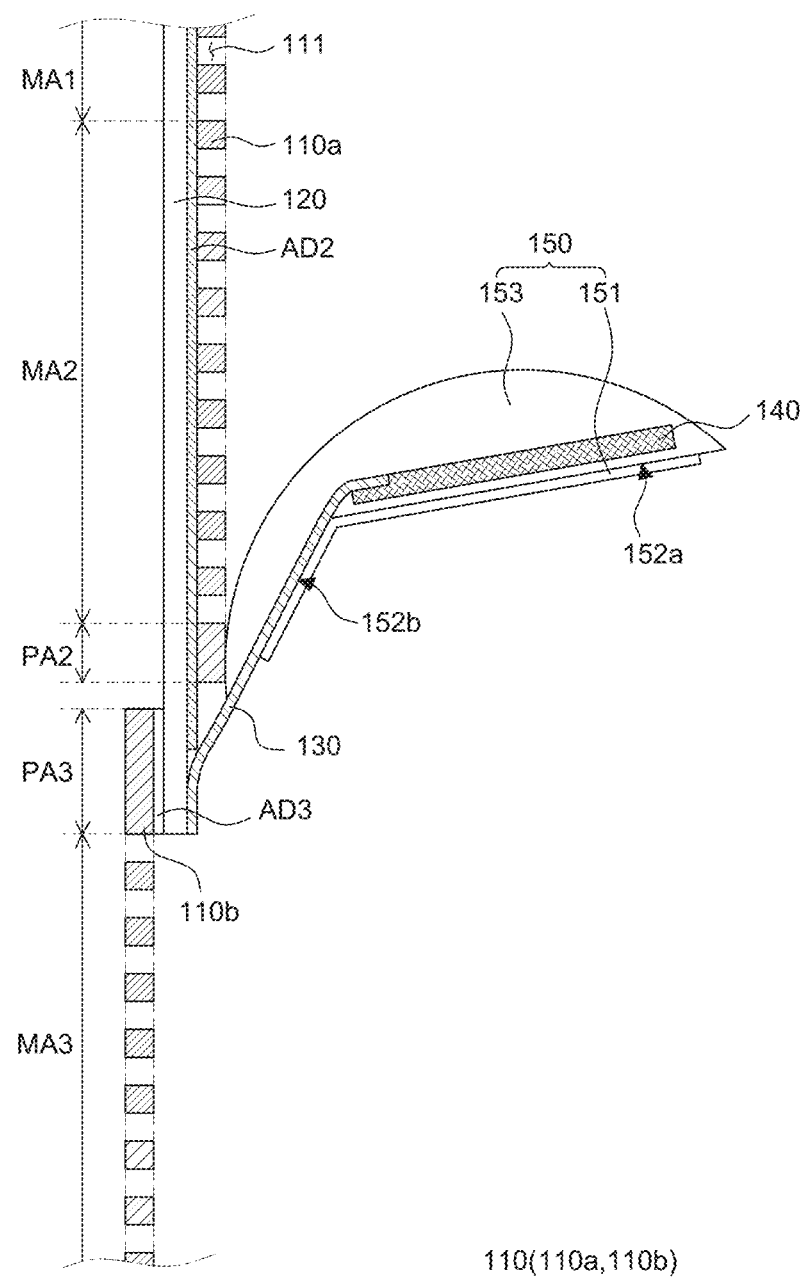
FIG. 7 is a cross-sectional view taken along the line VII-VII' of FIG. 4.

FIG. 7 is a cross-sectional view taken along the line VII-VII' of FIG. 4.

FIGS. 8A to 8D are cross-sectional views of a fastening process of a display device according to an exemplary embodiment of the present disclosure.

FIG. 4 is a plan view of a display unit DP seen from a viewing direction and FIG. 5 is a plan view of a display unit DP seen from a rear side of the display device.

Figure 8A:
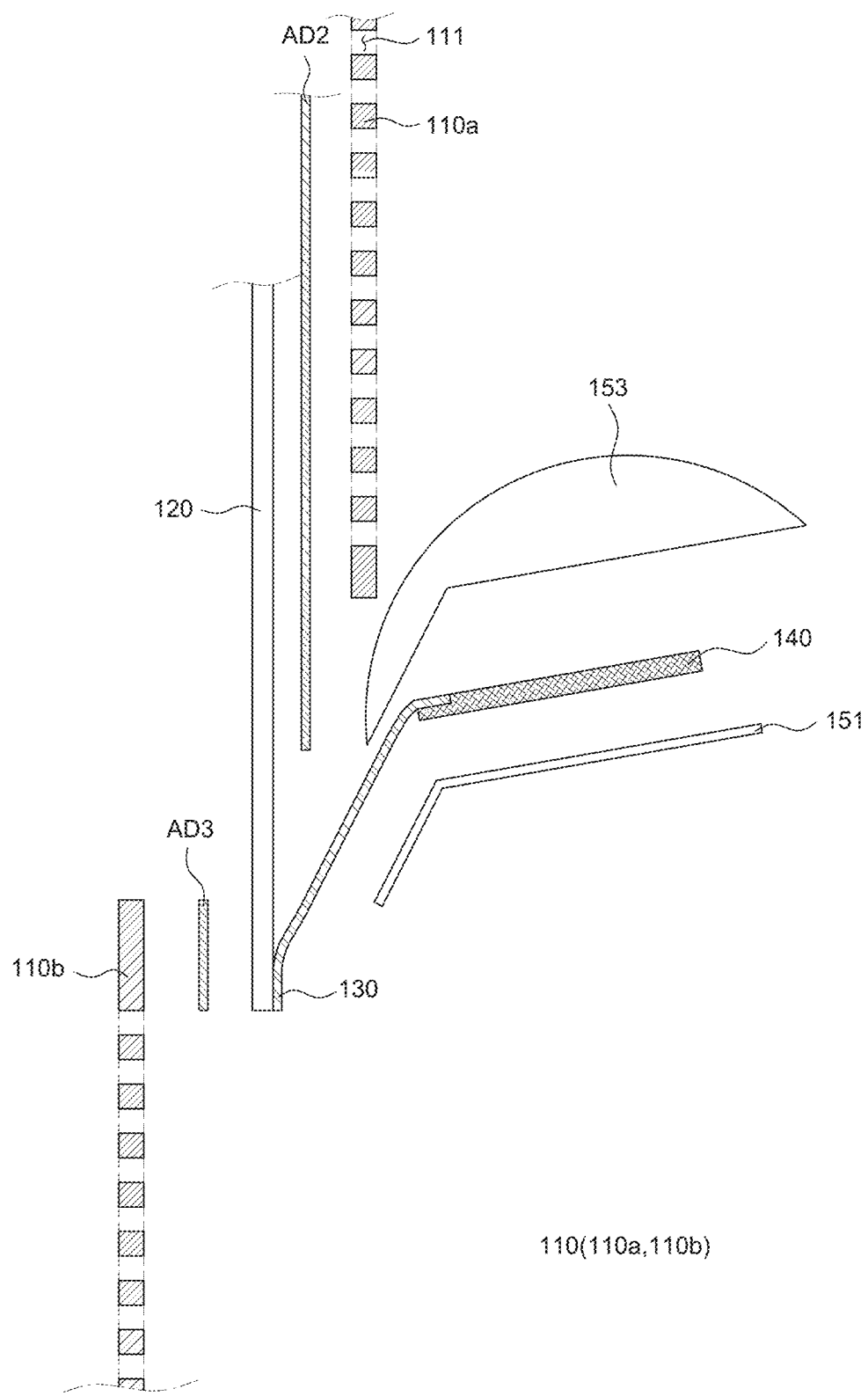
FIGS. 8A to 8D are cross-sectional views of a fastening process of a display device according to an exemplary embodiment of the present disclosure.
Figure 8B:
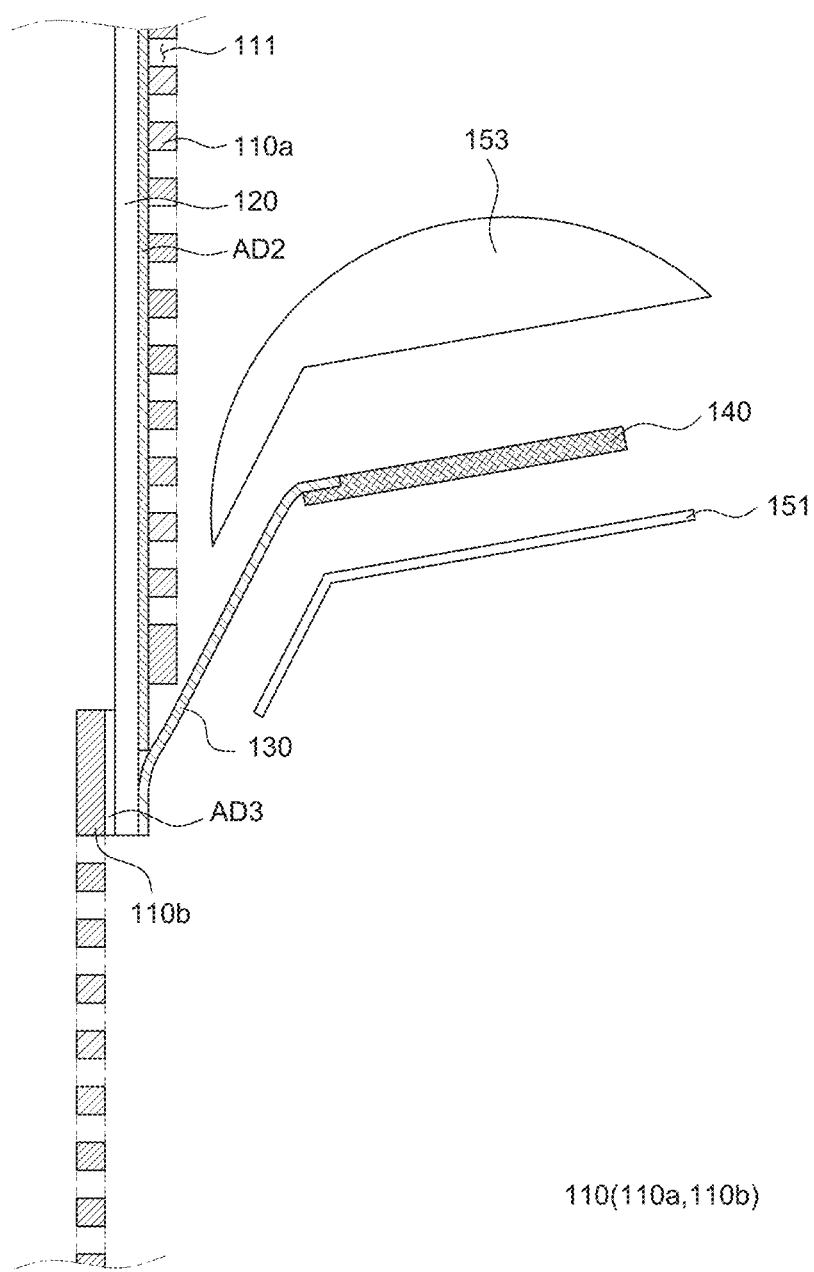
Figure 8C:
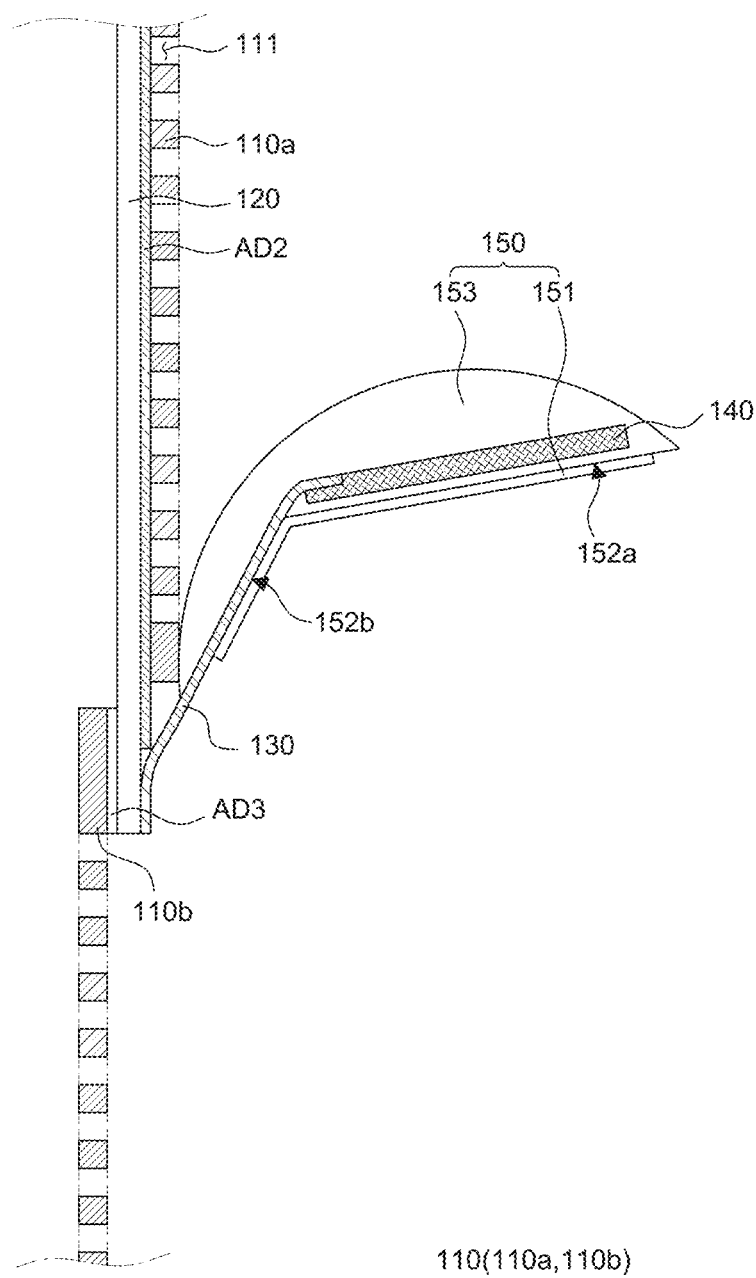
Figure 8D:
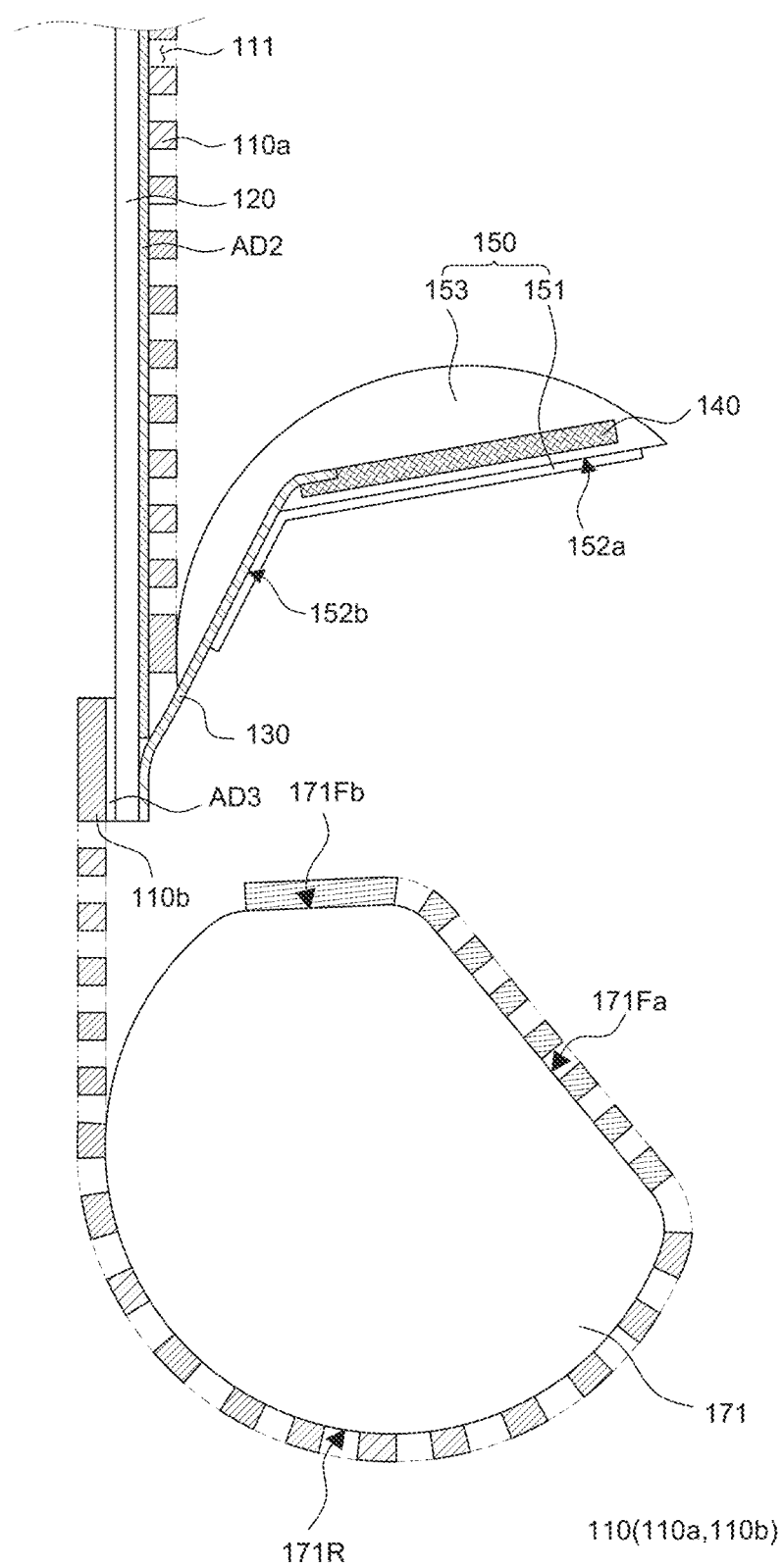

FIG. 8A illustrates a state of a first back cover 110*a*, a second back cover 110*b*, a display panel 120, and a cover unit 150 of the present disclosure before being fastened with each other. FIG. 8B illustrates a state in which the first back cover 110*a*, the second back cover 110*b*, and the display panel 120 are fastened with each other. FIG. 8C illustrates a state of the first back cover 110*a*, the second back cover 110*b*, the display panel 120, and the cover unit 150 after being fastened with each other. FIG. 8D illustrates a state in which the roller 171 is fastened with the second back cover 110*b*.

Referring to FIGS. 4 to 7 and FIGS. 8A to 8D, the display unit DP may include a back cover 110, a display panel 120, a plurality of flexible films 130, a printed circuit board 140, and a cover unit 150. In FIGS. 4 to 6, for the purpose of convenience, the cover unit 150 is not illustrated.

Referring to FIGS. 4 and 5, the back cover 110 according to the exemplary embodiment of the present disclosure is disposed on a rear surface (and on a front surface of a part of a lower end) of the display panel 120 to support the display panel 120, the plurality of flexible films 130, and the printed circuit board 140. A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120. For example, the back cover 110 may be formed of a metal material, such as steel use stainless (SUS) or invar, or plastic. However, if the material of the back cover 110 satisfies physical conditions such as a thermal strain amount, a radius of curvature, and a rigidity, the material may be diversely changed depending on the design and is not limited thereto.

The back cover 110 may include a plurality of support areas PA and a plurality of malleable areas MA. The plurality of support areas PA is areas where a plurality of openings 111 is not disposed and the plurality of malleable areas MA is areas where a plurality of openings 111 is disposed.

The back cover 110 according to the exemplary embodiment of the present disclosure may include a first back cover 110*a* and a second back cover 110*b*. That is, the back cover 110 according to the exemplary embodiment of the present disclosure may be configured to be divided into the first back cover 110*a* and the second back cover 110*b*. For example, the back cover 110 according to the exemplary embodiment of the present disclosure may be configured to be divided into the first back cover 110*a* which is disposed on a rear surface of the display panel 120 with respect to a lower end of the display panel 120 and the second back cover 110*b* which is disposed on a front surface of the display panel 120.

In this case, the first back cover 110*a* may be fastened with the head bar 182 and the second back cover 110*b* may be fastened with the roller 171.

The first back cover 110*a* may include a first support area PA1, a first malleable area MA1, a second support area PA2, and a second malleable area MA2, but is not limited thereto.

The second back cover 110*b* may include a third support area PA3, a third malleable area MA3, and a fourth support area PA4, but is not limited thereto.

Since the back cover 110 is wound or unwound in a column direction, the plurality of support areas PA and the plurality of malleable areas MA may be disposed along the column direction.

First, the first support area PA1 is an uppermost area of the first back cover 110*a* and is fastened with the head bar 182. The first support area PA1 includes first fastening holes AH1 to be fastened with the head bar 182. For example, the head bar 182 may be fastened with the first support area PA1 of the first back cover 110*a* through a screw which passes through the head bar 182 and the first fastening holes AH1. As the first support area PA1 is fastened with the head bar 182, when the link unit 181 which is fastened with the head bar 182 is lifted or lowered, the first back cover 110*a* may also be lifted and lowered together and the display panel 120 which is attached to the first back cover 110*a* may also be lifted and lowered together. Even though five first fastening holes AH1 are illustrated in FIGS. 4 and 5, the present disclosure is not limited thereto. Further, even though in FIGS. 4 and 5, it has been described that the first back cover 110*a* is fastened with the head bar 182 using the first fastening holes AH1, it is not limited thereto and the first back cover 110*a* and the head bar 182 may be fastened with each other without using a separate fastening hole.

The first malleable area MA1 is an area extending from the first support area PA1 to a lower side of the first back cover 110*a*. The first malleable area MA1 is an area in which a plurality of openings 111 may be disposed and the display panel 120 is attached. Specifically, the first malleable area MA1 is an area which is wound around or unwound from the roller 171 together with the display panel 120. The first malleable area MA1 may overlap at least the display panel 120 among other configurations of the display unit DP.

The second malleable area MA2 is an area extending from the first malleable area MA1 to a lower side of the first back cover 110*a*. A part of the cover unit 150 including the printed circuit board 140 connected to the plurality of flexible films 130 may be disposed on the rear surface of the second malleable area MA2.

The second malleable area MA2 is an area disposed between the first malleable area MA1 and the second support area PA2. A plurality of openings 111 is disposed in the second malleable area MA2.

The second malleable area MA2 is an area disposed between the first malleable area MA1 and the second support area PA2 such that the second support area PA2 is wound on the second flat portion 171Fb of an outer circumferential surface of the roller 171.

The second support area PA2 is an area extending from the second malleable area MA2 to a lower side of the first back cover 110*a*. Another part of the cover unit 150 including some of the plurality of flexible films 130 which is coupled to one end of the display panel 120 may be disposed on the rear surface of the second support area PA2.

The second support area PA2 may support to maintain the plurality of flexible films 130 to be flat without being bent when the plurality of flexible films 130 is rolled on the roller 171 to protect the plurality of flexible films 130.

Further, when the second support area PA2 is wound around the roller 171, a part of the outer circumferential surface of the roller 171 which is opposite to the second support area PA2 may be formed to be flat. Accordingly, the plurality of flexible films 130 disposed in the second support area PA2 may also be maintained to be flat.

Further, the third support area PA3 is an uppermost end area of the second back cover 110*b* and a lower end of the display panel 120 is attached thereto. For example, the lower side of the display panel 120 may be attached to the third support area PA3 by means of a third adhesive layer AD3.

The first back cover 110*a* of the second support area PA2 and the second back cover 110*b* of the third support area PA3 may be coupled by the display panel 120.

In the display device 100 according to the embodiment of the present disclosure, the back cover 110 is configured by the first back cover 110*a* and the second back cover 110*b* which are separated to form the back cover 110 so as to correspond to various sizes of the display panel 120. As the size of the display device 100 is gradually increased, the size of the display panel 120 is also increased. In this case, the back cover 110 needs to be larger than the display panel 120 to protect and support the display panel 120 so that a single back cover 110 needs to be manufactured to be large. However, when the single back cover 110 is manufactured to correspond to the large-sized display panel 120, there may be a difficulty in the manufacturing process. Therefore, in the display device 100 according to the exemplary embodiment of the present disclosure, the back cover 110 is configured by the first back cover 110*a* and the second back cover 110*b* and the first back cover 110*a* and the second back cover 110*b* may be coupled using the display panel 120. Accordingly, the first back cover 110*a* and the second back cover 110*b* may perform all the functions of the back cover 110 of the related art and the back cover 110 may be manufactured to be smaller so that the productivity of the back cover 110 may be improved.

The third malleable area MA3 is an area extending from the third support area PA3 to a lower side of the second back cover 110*b*. A plurality of openings 111 may be disposed in the third malleable area MA3. The third malleable area MA3 is an area extending to dispose the display area AA of the display panel 120 at the outside of the housing unit HP. That is, for example, when the back cover 110 and the display panel 120 are fully unwound, an area from the fourth support area PA4 of the second back cover 110*b* which is fixed to the roller 171 to the second malleable area MA2 in which the cover unit 150 is disposed may be disposed in the housing unit HP. The first malleable area MA1 and the first support area PA1 to which the display panel 120 is attached may be disposed at the outside of the housing unit HP. That is, when the display panel 120 is fully unwound, the fourth support area PA4 fixed to the roller 171, the third malleable area MA3, the third support area PA3, the second malleable area MA2, and the second support area PA2 extending from the fourth support area PA4 may be disposed in the housing unit HP. However, the present disclosure is not limited thereto.

If a length from the fourth support area PA4 to the second malleable area MA2 is smaller than a length from the fourth support area PA4 to the opening HPO of the housing unit HP, a part of the first malleable area MA1 to which the display panel 120 is attached may be disposed in the housing unit HP. Further, a part of a lower end of the display area AA of the display panel 120 is disposed in the housing unit HP so that there may be a difficulty in watching images. Therefore, the length from the fourth support area PA4 fixed to the roller 171 to the third malleable area MA3, the third support area PA3, the second support area PA2, and the second malleable area MA2 may be designed to be equal to the length from the fourth support area PA4 fixed to the roller 171 to the opening HPO of the housing unit HP.

The fourth support area PA4 is an area extending from the third malleable area MA3 to a lower side of the second back cover 110*b*. The fourth support area PA4 is a lowermost area of the second back cover 110*b* and is fastened with the roller 171. The fourth support area PA4 may include second fastening holes AH2 to be fastened with the roller 171. For example, screws which pass through the roller 171 and the second fastening holes AH2 are disposed to fasten the roller 171 and the fourth support area PA4 of the second back cover 110*b* with each other. As the fourth support area PA4 is fastened with the roller 171, the second back cover 110*b* may be wound around or unwound from the roller 171. Even though two second fastening holes AH2 are illustrated in FIGS. 4 and 5, the number of second fastening holes AH2 is not limited thereto.

In the first support area PA1, the second support area PA2, the third support area PA3, and the fourth support area PA4, the plurality of openings 111 as formed in the plurality of malleable areas MA is not formed. Specifically, the first fastening holes AH1 are formed in the first support area PA1 and the second fastening holes AH2 are formed in the fourth support area PA4, but the plurality of openings 111 as formed in the plurality of malleable areas MA is not formed in the first support area PA1, the second support area PA2, the third support area PA3, and the fourth support area PA4. Further, the first fastening holes AH1 and the second fastening holes AH2 have different shapes from that of the plurality of openings 111. The first support area PA1 is an area fixed to the head bar 182, the second support area PA2 and the third support area PA3 are areas where the flexible films 130 are supported, and the fourth support area PA4 is an area fixed to the roller 171. Therefore, the support areas may have a rigidity larger than that of the plurality of malleable areas MA.

As the first support area PA1, the second support area PA2, the third support area PA3, and the fourth support area PA4 have the rigidity, the first support area PA1 and the fourth support area PA4 may be firmly fixed to the head bar 182 and the roller 171. Further, the second support area PA2 and the third support area PA3 maintain the plurality of flexible films 130 to be flat so as not to be bent, thereby protecting the plurality of flexible films 130. Therefore, the display unit DP is fixed to the roller 171 and the head bar 182 of the driving unit MP to move to the inside or the outside of the housing unit HP in accordance with the operation of the driving unit MP and protect the plurality of flexible films 130.

In FIGS. 4 and 5, for example, even though it is illustrated that the plurality of support areas PA and the plurality of malleable areas MA of back cover 110 are sequentially disposed along the column direction, when the back cover 110 is wound in the row direction, the plurality of support areas PA and the plurality of malleable areas MA may be disposed along a row direction.

When the display unit DP is wound or unwound, the plurality of openings 111 disposed in the plurality of malleable areas MA of the back cover 110 may be deformed by a stress which is applied to the display unit DP. Specifically, when the display unit DP is wound or unwound, the plurality of malleable areas MA of the back cover 110 may be deformed as the plurality of openings 111 contracts or expands. Further, as the plurality of openings 111 contracts or expands, a slip phenomenon of the display panel 120 disposed on the plurality of malleable areas MA of the back cover 110 is minimized so that the stress which is applied to the display panel 120 may be minimized.

When the display panel 120 and the back cover 110 are wound, a difference between a length of the display panel 120 which is wound around the roller 171 and a length of the back cover 110 which is wound around the roller 171 may be caused due to the difference of radii of curvature of the display panel 120 and the back cover 110. For example, when the back cover 110 and the display panel 120 are wound around the roller 171, a length of the first back cover 110a and the second back cover 110b required for being wound around the roller 171 once may be different from a length of the display panel 120 required for being wound around the roller 171 once. That is, since the display panel 120 is disposed at the outside from the first back cover 110a with respect to the roller 171, a length of the display panel 120 required to be wound around the roller 171 once may be larger than a length of the first back cover 110a required to be wound around the roller 171 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In the display device 100 according to an exemplary embodiment of the present disclosure, even though the display unit DP is wound or unwound and a stress is applied to the display unit DP, the plurality of openings 111 of the back cover 110 is flexibly deformed to alleviate the stress applied to the back cover 110 and the display panel 120. For example, when the back cover 110 and the display panel 120 are wound around the roller 171 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress which is applied to the display panel 120 from the back cover 110 due to the deformation of the plurality of openings 111 when the back cover 110 and the display panel 120 are wound may also be alleviated.

Referring to FIG. 4, the display panel 120 may be disposed on one surface of the first back cover 110a. For example, the display panel 120 may be disposed in the first malleable area MA1, on one surface of the first back cover 110a.

The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel 120, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel as an example, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 171.

Referring to FIG. 4, the display panel 120 may include a display area AA and a non-display area NA.

The display area AA is an area where images are displayed in the display panel 120. In the display area AA, a plurality of sub pixels which configures the plurality of pixels and a driving circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element, a wiring line, and the like. For example, the driving circuit may be configured by a thin film transistor, a storage capacitor, a gate line, a data line, and the like, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and driving circuits of the display area AA or a driving IC such as a gate driver IC or a data driver IC may be disposed, but the non-display area is not limited thereto. The pad area may be located in the non-display area NA below the display panel 120.

Referring to FIG. 6, the display panel 120 may include a substrate 121, a buffer layer 122, a pixel unit 123, an encapsulating layer 124, and an encapsulating substrate 125.

The substrate 121 is a base member which supports various components of the display panel 120 and may be configured by an insulating material. The substrate 121 may be formed of a material having flexibility so that the display panel 120 is wound or unwound. For example, the substrate 121 may be formed of a plastic material such as polyimide PI.

The buffer layer 122 is disposed on the substrate 121. The buffer layer 122 suppresses moisture and/or oxygen which permeate from the outside of the substrate 121 from being spread. The buffer layer 122 may be formed of an inorganic material, for example, may be configured by a single layer or a double layer of silicon oxide SiOx or silicon nitride SiNx, but is not limited thereto.

The pixel unit 123 is disposed on the substrate 121 and a top surface of the buffer layer 122. The pixel unit 123 may include a plurality of organic light emitting diodes and a circuit for driving the plurality of organic light emitting diodes. The pixel unit 123 may be disposed so as to correspond to the display area AA.

The display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

The encapsulating layer 124 is disposed to cover the pixel unit 123.

The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulating substrate 125 is disposed on the encapsulating layer 124. For example, the encapsulating substrate 125 is disposed between the encapsulating layer 124 and the first back cover 110a. The encapsulating substrate 125 may protect the organic light emitting diode of the pixel unit 123 together with the encapsulating layer 124. The encapsulating substrate 125 may protect the organic light emitting diode of the pixel unit 123 from moisture, oxygen, and impacts of the outside. For example, the encapsulating substrate 125 may be formed of a material having a high modulus of approximately 200 to 900 MPa. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 may be disposed between the encapsulating layer 124 and the encapsulating substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA) but is not limited thereto.

The first adhesive layer AD1 may be disposed so as to enclose the encapsulating layer 124 and the pixel unit 123. That is, the pixel unit 123 may be sealed by the buffer layer 122 and the encapsulating layer 124 and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

A second adhesive layer AD2 may be disposed between the encapsulating substrate 125 and the first back cover 110a. The second adhesive layer AD2 may bond the encapsulating substrate 125 and the first back cover 110a to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA) but is not limited thereto.

Even though in FIG. 6, it is illustrated that the plurality of openings 111 of the first back cover 110a is not filled with the second adhesive layer AD2, the second adhesive layer AD2 may be filled in some or all of the plurality of openings 111 of the first back cover 110a. If the second adhesive layer AD2 is filled inside the plurality of openings 111 of the first back cover 110a, a contact area between the second adhesive layer AD2 and the first back cover 110*a* is increased so that a separation phenomenon between the second adhesive layer AD2 and the first back cover 110*a* may be avoided.

Referring to FIGS. 7 and 8A to 8D, the second adhesive layer AD2 may not be applied to the pad area to which the plurality of flexible films 130 is attached. Further, the third support area PA3 of the second back cover 110*b* may be attached to a lower side of the display panel 120 by means of the third adhesive layer AD3.

The second adhesive layer AD2 and the third adhesive layer AD3 may include a double-sided adhesive tape.

Even though not illustrated in the drawing, a polarizing plate may be disposed on a rear surface of the display panel 120. The polarizing plate selectively transmits light to reduce the reflection of external light which is incident onto the display panel 120. Specifically, the display panel 120 may include various metal materials applied to the semiconductor element, the wiring line, the organic light emitting diode, and the like. Therefore, the external light incident onto the display panel 120 may be reflected from the metal material so that the visibility of the display device 100 may be reduced due to the reflection of the external light. Therefore, when the polarizing plate is disposed, the polarizing plate suppresses the reflection of the external light to increase the outdoor visibility of the display device 100. However, the polarizing plate may be omitted depending on an implementation embodiment of the display device 100.

Referring to FIGS. 7 and 8A to 8D, a part of the plurality of flexible films 130 may be disposed in the second support area PA2 of the first back cover 110*a* and the third support area PA3 of the second back cover 110*b*. The plurality of flexible films 130 is films in which various components are disposed on a base film having a malleability and supplies a signal to the plurality of sub pixels and the driving circuits which configure the plurality of pixels of the display area AA and is electrically connected to the display panel 120. One ends of the plurality of flexible films 130 are disposed in the non-display area NA of the display panel 120 to supply a power voltage or a data voltage to the plurality of sub pixels and the driving circuits of the display area AA. The number of the plurality of flexible films 130 may vary depending on the design and is not limited thereto.

A driving IC such as a gate driver IC or a data driver IC may be disposed on the plurality of flexible films 130. The driving IC is a component which processes data for displaying images and a driving signal for processing the data. The driving IC may be disposed by a chip on glass (COG), a chip on film (COF), a tape carrier package (TCP), or the like depending on a mounting method. However, for the convenience of description, it is described that the driving IC is mounted on the plurality of flexible films 130 by a chip on film technique but is not limited thereto.

That is, the printed circuit board 140 is disposed in the second malleable area MA2 of the first back cover 110*a* to be coupled to the plurality of flexible films 130. The printed circuit board 140 is a component which supplies signals to the driving IC. Various components may be disposed in the printed circuit board 140 to supply various signals such as a driving signal or a data signal to the driving IC. The number of printed circuit board 140 may vary depending on the design and is not limited thereto.

Even though not illustrated in FIG. 7, an additional printed circuit board which is connected to the printed circuit board 140 may be further disposed. For example, the printed circuit board 140 may be referred to as a source printed circuit board S-PCB on which the data driver is mounted and the additional printed circuit board connected to the printed circuit board 140 may be referred to as a control printed circuit board C-PCB on which the timing controller is mounted. For example, the additional printed circuit board may be disposed in the roller 171, disposed in the housing unit HP at the outside of the roller 171, or disposed to be in direct contact with the printed circuit board 140.

Referring to FIGS. 7 and 8A to 8D, the display unit DP according to the present disclosure may include the cover unit 150.

The cover unit 150 according to the exemplary embodiment of the present disclosure is disposed on the rear surface of the first back cover 110*a* rather than the front surface of the display panel 120 to implement the reverse-bonding of the flexible film 130. The first back cover 110*a* supports only an area to the display area AA and the second back cover 110*b* supports an area from the routing line area at the lower end of the display area AA.

That is, according to the present disclosure, in the large-sized rollable display device 100, while the position of the cover unit 150 is changed, the fastening position of the plurality of flexible films 130 and the printed circuit board 140 is changed to fix the plurality of flexible films 130.

In the related art, when the display panel is rolled, the flexible films are also repeatedly rolled so that the flexible films are bent to be fastened by considering that a tension is generated in the flexible film until it is rolled from before being fastened. However, the printed circuit board is distorted and the cable is pulled to cause the tension in the flexible film, which causes the crack in the pad area.

Accordingly, according to the present disclosure, the cover unit 150 is disposed on the rear surface of the first back cover 110*a*, the first back cover 110*a* supports only an area to the display area AA of the display panel 120 and the second back cover 110*b* supports an area from the routing line area at the lower end of the display area AA. Therefore, the reverse-bonding of the flexible film 130 can be implemented and the spring back effect caused when the end of the display panel 120 is rolled may be lowered. That is, the cover unit 150 is fixed to the rear surface of the first back cover 110*a* and the flexible film 130 may be fixed in the cover unit 150 after being reversibly bonded. As a result, the display panel 120 may be maintained to be flat even during the repeated winding and unwinding and the plurality of flexible films 130 also maintains the same shape so that the crack of the pad area due to the tension of the flexible film 130 may be improved.

Further, according to the present disclosure, a shape of the outer circumferential surface of the cover unit 150 configures an arc and the bottom surfaces 152*a* and 152*b* configure a plane which is bent with two levels to correspond to the first and second flat portions 171Fa and 171Fb of the roller 171. That is, the bottom surfaces 152*a* and 152*b* may be configured by a first bottom surface 152*a* corresponding to the first flat portion 171Fa and a second bottom surface 152*b* corresponding to the second flat portion 171Fb.

Referring to FIGS. 7 and 8A to 8D, the cover unit 150 of the present disclosure is disposed in the second support area PA2 and the second malleable area MA2 of the first back cover 110*a* to accommodate a part of the plurality of flexible films 130 and the printed circuit board 140. The cover unit 150 of the present disclosure accommodates the printed circuit board 140 to protect the printed circuit board 140.

The cover unit 150 of the present disclosure may be partially fastened on the rear surface of the second support area PA2 of the first back cover 110*a* to be fixed but is not limited thereto. To this end, the third fastening hole may be formed in the second support area PA2 of the first back cover 110a. The cover unit 150 may be fastened with the first back cover 110a by means of the third fastening hole.

The cover unit 150 according to the present disclosure may include a base plate 151 and a cover plate 153.

The base plate 151 is bent with two levels to be disposed on the rear surface of the printed circuit board 140, that is, the first and second bottom surfaces 152a and 152b of the cover plate 153. The base plate 151 may be fixed to the cover plate 153 of the cover unit 150 on an opposite surface of one surface of the first back cover 110a on which the display panel 120 is not disposed, that is, on the rear surface. Therefore, the base plate 151 of the cover unit 150 may support the printed circuit board 140 together with the cover plate 153. For example, the base plate 151 is formed of a material having a rigidity to support the printed circuit board 140 to be flat but is not limited thereto.

The cover plate 153 is disposed on the rear surface of the first back cover 110a.

The cover plate 153 may be disposed on the rear surface of the first back cover 110a.

The cover plate 153 may be disposed so as to cover the printed circuit board 140 disposed in the second malleable area MA2 of the first back cover 110a and have a convex shape. That is, one surface of the cover plate 153 may be formed as a curved surface. The cover plate 153 is formed of a material having a rigidity to protect the printed circuit board 140 but is not limited thereto. The first and second bottom surfaces 152a and 152b of the cover plate 153 may configure a plane which is bent with two levels.

Further, the cover unit 150 may maintain its original state without being bent when the display unit DP is wound to protect the plurality of flexible films 130 and the printed circuit board 140. Specifically, when the display unit DP is wound, the base plate 151 of the cover unit 150 having the rigidity maintains a flat state without being bent to protect the printed circuit board 140. A part of the roller 171 around which the base plate 151 is wound may be formed as a malleable area so that the base plate 151 is not bent. For example, the roller 171 may be configured by a first flat portion 171Fa, a second flat portion 171Fb, and a curved portion 171R and the base plate 151 is bent with two levels to be seated on the first flat portion 171Fa and the second flat portion 171Fb, respectively. Therefore, even though the display unit DP is wound, the base plate 151 may be maintained to be flat without being bent.

Next, when the display unit DP is wound, the cover plate 153 of the cover unit 150 having the rigidity may maintain an original convex shape without being deformed to protect the plurality of flexible films 130 and the printed circuit board 140. The cover plate 153 having a convex shape may form a circular shape together with the curved portion 171R of the roller 171. For example, the first and second bottom surfaces 152a and 152b of the base plate 151 having a convex shape configure a plane bent with two levels and are seated in the first flat portion 171Fa and the second flat portion 171Fb of the roller 171 corresponding thereto to form a substantially circular shape together with the curved portion 171R of the roller 171. Accordingly, the cover unit 150 and the roller 171 substantially form one circular shape and a part of the display panel 120 which is wound on the cover unit 150 is possible to be wound with a larger radius of curvature so that a stress applied to the display panel 120 may be reduced.

When the cover unit is located on the front surface of the back cover, the routing line area matches a 25R section. In contrast, according to the present disclosure, the cover unit 150 is located on the rear surface of the back cover 110 so that the routing line area meets a cover unit 150 with 40R. Further, in the related art, as the printed circuit board and the display panel are rolled, an angle of the plurality of flexible films changes significantly so that the plurality of flexible films may be floated. In contrast, according to the present disclosure, the angle of the plurality of flexible films 130 and the printed circuit board 140 and the display panel 120 hardly changes and the angle of the plurality of flexible films 130 and the printed circuit board 140 may be fixed by the base plate 151.

Hereinafter, a process of winding the display unit DP around the roller 171 will be described in detail with reference to FIGS. 9A to 9D.

<Winding Process of Back Cover and Display Panel>

FIGS. 9A to 9D are cross-sectional views in accordance with a driving state of a display device according to an exemplary embodiment of the present disclosure.

Figure 9A:
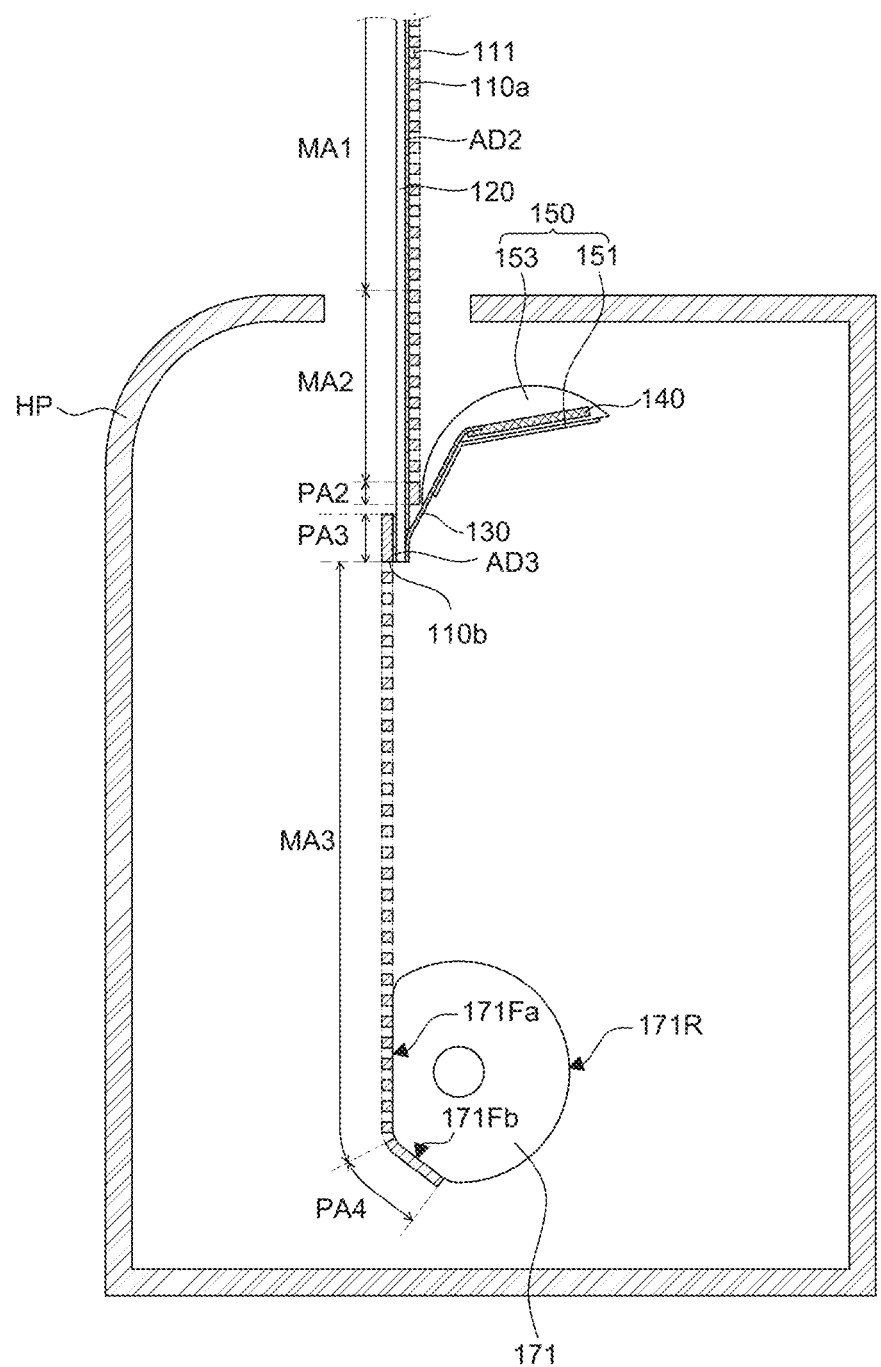
FIGS. 9A to 9D are cross-sectional views in accordance with a driving state of a display device according to an exemplary embodiment of the present disclosure.
Figure 9B:
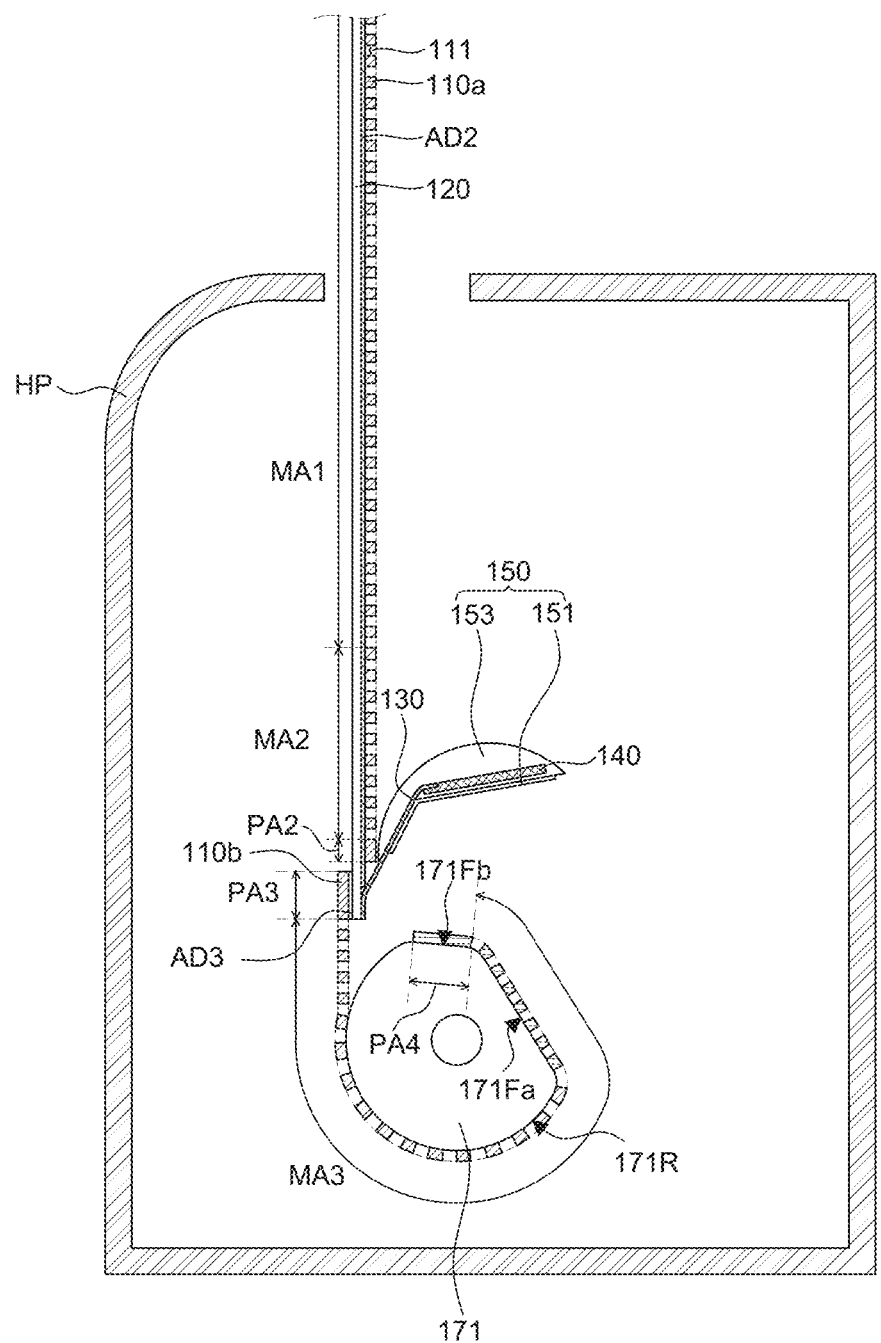
Figure 9C:
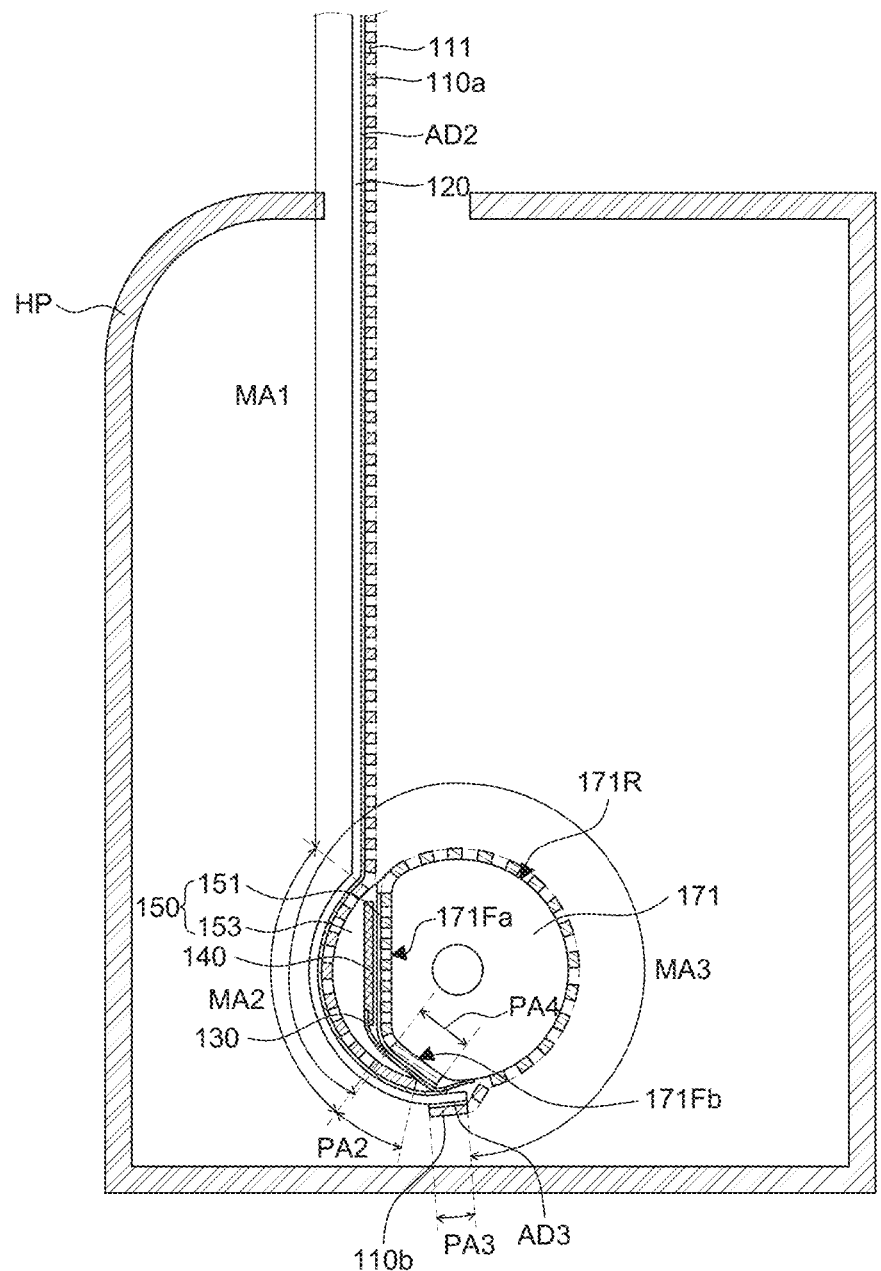
Figure 9D:
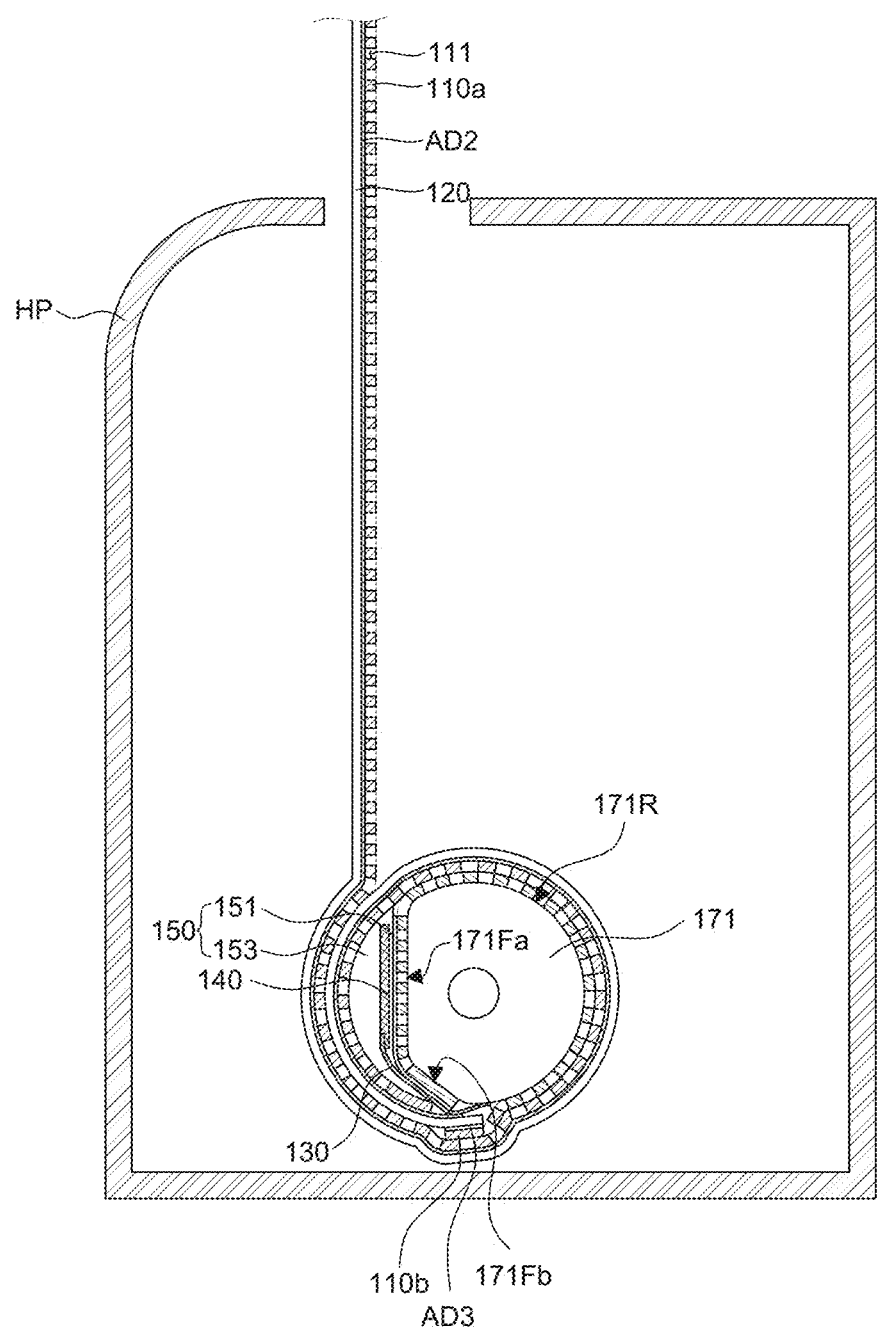

FIG. 9A is a cross-sectional view illustrating a state in which the back cover 110 is fully unwound from the roller 171. FIG. 9B is a cross-sectional view illustrating a state in which the fourth support area PA4 and the third malleable area MA3 of the second back cover 110b are wound around the roller 171. FIG. 9C is a cross-sectional view illustrating a state in which the fourth support area PA4, the third malleable area MA3, and the third support area PA3 of the second back cover 110b and the second support area PA2 and the second malleable area MA2 of the first back cover 110a are wound around the roller 171. FIG. 9D is a cross-sectional view illustrating a state in which the fourth support area PA4, the third malleable area MA3, and the third support area PA3 of the second back cover 110b and the second support area PA2, the second malleable area MA2, and the first malleable area MA1 of the first back cover 110a are wound around the roller 171.

Referring to FIG. 9A, the roller 171 is entirely cylindrical, but a part thereof may be flat. For example, a part of an outer circumferential surface of the roller 171 may be configured by a first flat portion 171Fa and a second flat portion 171Fb which are formed to be flat and the remaining part of the outer circumferential surface may be configured by a curved portion 171R formed with a curved surface. That is, for example, the second flat portion 171Fb may extend from one end of the first flat portion 171Fa and the curved portion 171R may extend from the other end of the first flat portion 171Fa toward the second flat portion 171Fb. In this case, the second flat portion 171Fb is an area where the plurality of flexible film 130 is mainly disposed and the first flat portion 171Fa is an area where the printed circuit board 140 is disposed. Therefore, in order to accommodate the printed circuit board 140 having a relatively larger size, a size and an area of the first flat portion 171Fa may be larger than a size and an area of the second flat portion 171Fb. Further, a length of the first flat portion 171Fa with respect to a direction perpendicular to the length direction of the roller 171 may also be larger than that of the second flat portion 171Fb.

The fourth support area PA4 of the second back cover 110b may be fastened with one of the first flat portion 171Fa and the second flat portion 171Fb of the roller 171. For example, the fourth support area PA4 may be fastened with the first flat portion 171Fa of the roller 171 and the fourth support area PA4 may be fastened with the second flat portion 171Fb of the roller 171. Except for the fourth support area PA4 fastened with the roller 171, the remaining part of the second back cover 110b extending from the fourth support area PA4 may be flat. Hereinafter, it is assumed that the fourth support area PA4 of the second back cover 110b is fastened with the second flat portion 171Fb but is not limited thereto.

As described above, when the back cover 110 is fully unwound, the fourth support area PA4, the third malleable area MA3, the third support area PA3, and the second malleable area MA2 of the back cover 110 may be disposed in the housing unit HP. Further, the first support area PA1 and the first malleable area MA1 may be disposed at the outside of the housing unit HP. Therefore, the display panel 120 may be disposed at the outside of the housing unit HP to display the image and the plurality of flexible films 130 and the printed circuit board 140 may be disposed at the inside of the housing unit HP so as not to be visibly recognized.

Next, referring to FIG. 9B, the fourth support area PA4 and the third malleable area MA3 are wound around the roller 171 and the third support area PA3 extending from the third malleable area MA3 and the second support area PA2, the second malleable area MA2, the first malleable area MA1, and the first support area PA1 of the first back cover 110a are unwound.

In the second flat portion 171Fb of the roller 171, the fourth support area PA4 may be wound and in the first flat portion 171Fa, a part of the third malleable area MA3 may be wound. The remaining part of the third malleable area MA3 may be wound in the curved portion 171R.

Next, referring to FIG. 9C, the fourth support area PA4, the third malleable area MA3, the third support area PA3, the second malleable area MA2, and the second support area PA2 are wound around the roller 171 and the first malleable area MA1 and the first support area PA1 extending from the second malleable area MA2 are unwound.

The second support area PA2 may be wound on the second flat portion 171Fb of the roller 171 on which the fourth support area PA4 is wound and the second malleable area MA2 may be wound on the first flat portion 171Fa on which a part of the third malleable area MA3 is wound, but it is not limited thereto.

When the second support area PA2 and the second malleable area MA2 in which the cover unit 150 is disposed are wound around the roller 171, the curved portion 171R of the roller 171 and the cover unit 150 may form a circular shape.

The second support area PA2 in which the plurality of flexible films 130 is disposed is wound on the second flat portion 171Fb of the roller 171 so that at least a part of the plurality of flexible films 130 and the second support area PA2 may be maintained to be flat.

The second malleable area MA2 in which the printed circuit board 140 and a part of the cover unit 150 are disposed may be wound on the first flat portion 171Fa of the roller 171.

Accordingly, at least a part of the plurality of flexible films 130 may be maintained to be flat regardless of whether the display unit DP is wound or unwound, and the damage caused when the plurality of flexible films 130 is bent may be minimized.

In order to wind the second support area PA2 on the second flat portion 171Fb, the first back cover 110a may be configured to be bent at a boundary of the second support area PA2.

Referring to FIG. 9D, the fourth support area PA4, the third malleable area MA3, the third support area PA3, the second malleable area MA2, the second support area PA2, and a part of the first malleable area MA1 are wound around the roller 171. In contrast, the remaining part of the first malleable area MA1 and the first support area PA1 are unwound.

For example, a part of the first malleable area MA1 is wound on the second flat portion 171Fb of the roller 171 on which the fourth support area PA4 and the second support area PA2 are wound. The other part of the first malleable area MA1 is wound on the first flat portion 171Fa on which the third malleable area MA3 and the second malleable area MA2 are wound. Further, another part of the first malleable area MA1 may be wound on the curved portion 171R on which the third malleable area MA3 is wound.

The first malleable area MA1 may be wound with a substantially circular shape. Specifically, the first and second bottom surfaces 152a and 152b of the base plate 151 having a convex shape configure a flat surface bent with two levels and are seated in the first flat portion 171Fa and the second flat portion 171Fb of the roller 171 corresponding thereto to form a substantially circular shape together with the curved portion 171R of the roller 171. Accordingly, the cover unit 150 and the roller 171 substantially form one circular shape and a part of the first malleable area MA1 which is wound on the cover unit 150 may be wound while forming a substantially circular shape.

The roller 171 according to the exemplary embodiment of the present disclosure is configured by the first flat portion 171Fa, the second flat portion 171Fb, and the curved portion 171R. Further, a radius of curvature at the boundary of the first flat portion 171Fa and the second flat portion 171Fb may be smaller than the radius of curvature of the curved portion 171R. Further, a radius of curvature at the boundary of the first flat portion 171Fa and the curved portion 171R and a radius of curvature at the boundary of the second flat portion 171Fb and the curved portion 171R may also be smaller than the radius of curvature of the curved portion 171R. The radius of curvature indicates a degree of bending so that the larger the radius of curvature, it is close to the flat surface. Therefore, a part of the display unit DP which is wound at the boundary of the first flat portion 171Fa and the second flat portion 171Fb, the boundary of the first flat portion 171Fa and the curved portion 171R, and the boundary of the second flat portion 171Fb and the curved portion 171R is bent more than the remaining part of the display unit DP wound on the first flat portion 171Fa, the second flat portion 171Fb, and the curved portion 171R. Therefore, more stress may be applied. When the display unit DP is fully wound, the first malleable area MA1 of the first back cover 110a and the display panel 120 may be wound on the first flat portion 171Fa, the second flat portion 171Fb, and the curved portion 171R. Since the back cover 110 is formed of a material having a rigidity, even though stress is applied, the back cover 110 may not be easily cracked. In contrast, the display panel 120 may be easily cracked due to the stress increased due to the small radius of curvature.

Therefore, in the display device 100 according to the exemplary embodiment of the present disclosure, when the display unit DP is wound with an increased radius of curvature with which the display panel 120 is wound, a stress applied to the display panel 120 may be alleviated. Specifically, the second back cover 110b is wound around the roller 171 from the fourth support area PA4 below the second back cover 110b so that the fourth support area PA4, the third malleable area MA3, the third support area PA3, the second malleable area MA2, and the second support area PA2 of the back cover 110 are wound around the roller 171. Thereafter, the first malleable area MA1 of the first back cover 110a and the display panel 120 may be wound on the fourth support area PA4, the third malleable area MA3, the third support area PA3, the second malleable area MA2, and the second support area PA2. That is, the cover unit 150 on which the second malleable area MA2 of the first back cover 110a is wound is wound on the roller 171 and then the first malleable area MA1 of the first back cover 110a and the display panel 120 may be wound on the cover unit 150. One surface of the cover plate 153 of the cover unit 150 is formed as a curved surface. Therefore, when the cover unit 150 is wound around the roller 171, the cover plate 153 and the curved portion 171R may form a substantially circular shape. Therefore, the display panel 120 is wound on the cover unit 150 and the curved portion 171R so that when the display unit DP is wound, the stress applied to the display panel 120 may be alleviated. That is, the display panel 120 is not bent at the boundary of the first flat portion 171Fa and the second flat portion 171Fb, the boundary of the first flat portion 171Fa and the curved portion 171R, and the boundary of the second flat portion 171Fb and the curved portion 171R with a relatively smaller radius of curvature. However, the display panel 120 is bent on the cover unit 150 and the curved portion 171R with a relatively large radius of curvature so that the stress applied to the display panel 120 may also be reduced. Therefore, the cover plate 153 having a radius of curvature corresponding to the curved portion 171R according to the exemplary embodiment of the present disclosure is disposed so that the display panel 120 may be bent with a relatively larger radius of curvature and the stress applied to the display panel 120 may be reduced.

In the display device 100 according to the exemplary embodiment of the present disclosure, the plurality of flexible films 130 and the printed circuit board 140 are disposed in the second support area PA2 and the second malleable area MA2 of the first back cover 110a. Further, the cover unit 150 which accommodates the plurality of flexible films 130 and the printed circuit board 140 is disposed. Therefore, the damage of the plurality of flexible films 130 and the printed circuit board 140 may be minimized. Specifically, when the display unit DP is wound around the roller 171, the back cover 110 may be wound while being bent in accordance with the shape of the roller 171. However, when the plurality of flexible films 130 and the printed circuit board 140 are bent in accordance with the shape of the roller 171, the stress may be applied to the plurality of flexible films 130 and the printed circuit board 140. Specifically, the printed circuit board 140 formed of a hard material may be broken. In this case, the second support area PA2 is an area where the plurality of openings 111 is not disposed and a flat state is always maintained and may support the plurality of flexible films 130 disposed in the second support area PA2 to be maintained in a flat state. Here, the cover unit 150 formed of a material having a rigidity is disposed to protect the plurality of flexible films 130 and the printed circuit board 140. Further, a part of the roller 171 on which the second support area PA2 and the second malleable area MA2 are wound is formed by the first flat portion 171Fa and the second flat portion 171Fb so that the second support area PA2 may be flatly wound around the roller 171. Therefore, the second support area PA2 may maintain the flat state even though it is wound around the roller 171 and the plurality of flexible films 130 disposed in the second support area PA2 may also maintain the flat state. For example, when the display unit DP is fully wound, the plurality of flexible films 130 and the printed circuit board 140 are seated on the first flat portion 171Fa and the second flat portion 171Fb of the roller 171 to maintain a flat state. Further, the cover unit 150 is disposed to cover the plurality of flexible films 130 and the printed circuit board 140 so that even though other configurations of the display unit DP is wound on the plurality of flexible films 130 and the printed circuit board 140, it does not interfere with the plurality of flexible films 130 and the printed circuit board 140. Therefore, in the display device 100 according to the exemplary embodiment of the present disclosure, the plurality of flexible films 130, the printed circuit board 140, and the cover unit 150 are disposed in the second support area PA2 and the second malleable area MA2. As a result, it is possible to maintain the plurality of flexible films 130 to be flat and protect the plurality of flexible films from the external impact. Furthermore, in the display device 100 according to the exemplary embodiment of the present disclosure, the first flat portion 171Fa and the second flat portion 171Fb which are flat are formed on a part of the outer circumferential surface of the roller 171. Therefore, the plurality of flexible films 130 and the printed circuit board 140 are not bent and the damage of the plurality of flexible films 130 and the printed circuit board 140 may be minimized. Furthermore, in the display device 100 according to the exemplary embodiment of the present disclosure, the plurality of flexible films 130 and the printed circuit board 140 may be fixed by the cover unit 150 so as not to be bent.

In the display device 100 according to the exemplary embodiment of the present disclosure, the first flat portion 171Fa and the second flat portion 171Fb of the roller 171 on which the plurality of flexible films 130 and the printed circuit board 140 are seated, respectively, are separately formed. Therefore, a design margin of the plurality of flexible films 130 and the printed circuit board 140 may be ensured. As compared with a case in which one flat portion on which the plurality of flexible films 130 and the printed circuit board 140 are seated is formed on the roller 171, when the first flat portion 171Fa in which the plurality of flexible films 130 is seated and the second flat portion 171Fb in which the printed circuit board 140 is seated are separately formed, a size of an area where the plurality of flexible films 130 and the printed circuit board 140 are disposed may be increased.

Hereinafter, a shape of the roller 171 according to the present disclosure will be described in more detail with reference to FIGS. 10A and 10B.

<Shape of Roller>

Figure 10A:
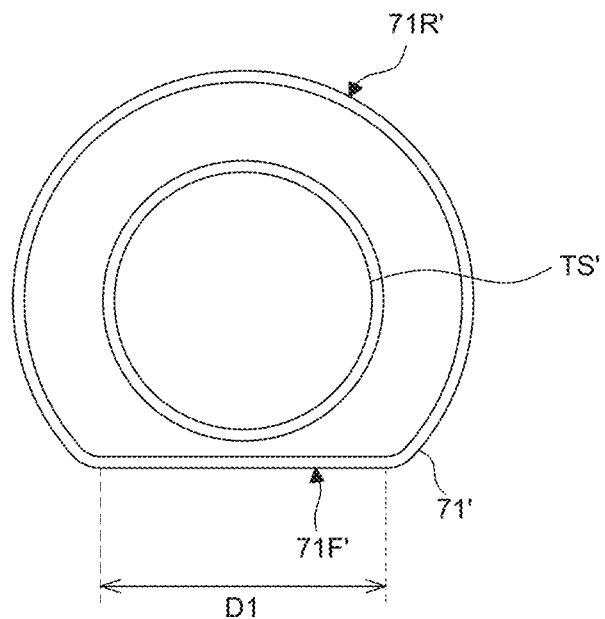
FIG. 10A is a schematic cross-sectional view of a roller according to a comparative embodiment.

FIG. 10A is a schematic cross-sectional view of a roller according to a comparative embodiment.

Figure 10B:
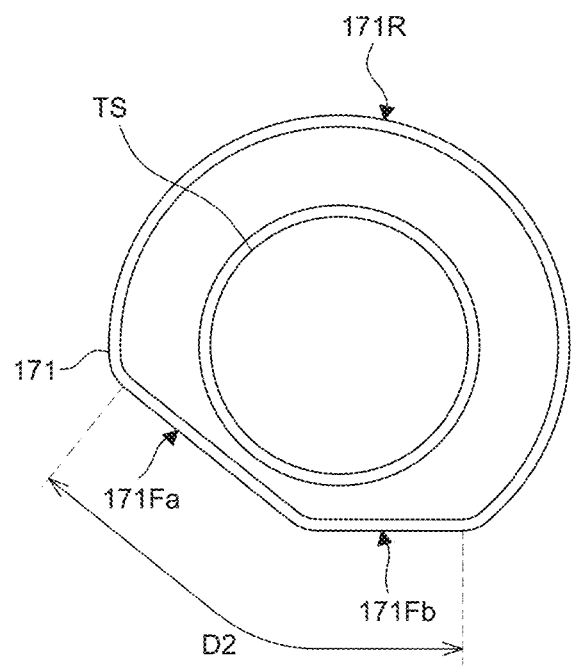
FIG. 10B is a schematic cross-sectional view of a roller according to an exemplary embodiment of the present disclosure.

FIG. 10B is a schematic cross-sectional view of a roller according to an exemplary embodiment of the present disclosure.

FIG. 10A is a cross-sectional view of a roller 71' of a display device according to a comparative embodiment. FIG. 10B is a cross-sectional view of a roller 171 of a display device according to an exemplary embodiment.

As compared with the roller 171 of the display device 100 according to the exemplary embodiment of the present disclosure, in a roller 71' of the display device according to a comparative embodiment of FIG. 10A, only one flat portion 71F' is disposed. The roller 171 of the display device according to the exemplary embodiment of FIG. 10B has the same structure as the roller 171 of the display device 100 according to the exemplary embodiment of the present disclosure.

Referring to FIGS. 10A and 10B, torsion springs TS' and TS may be further disposed in the rollers 71' and 171 to rotate the rollers 71' and 171. The torsion springs TS and TS' are disposed in the roller 71' and 171 to supply additional force to the rollers 71' and 171 when the display unit DP is wound. Further, in the rollers 71' and 171, a predetermined space is necessary to dispose the torsion springs TS' and TS.

Referring to FIG. 10A, the roller 71' according to the comparative embodiment is configured by one flat portion 71F' and a curved portion 71R'. When the display unit is wound, the plurality of flexible films and the printed circuit board may be seated in the flat portion 71F'. In this case, the flat portion 71F' may be formed so as not to interfere with the torsion spring TS' in the roller 71'.

When one flat portion 71F' is formed so as not to interfere with the torsion spring TS', a maximum length of the flat portion 71F' may be a first length D1. A length from one end of the plurality of flexible films to the other end of the printed circuit board may be equal to or smaller than the first length D1. Specifically, when the display unit is wound, the plurality of flexible films and the printed circuit board need to be seated in the flat portion 71F' so as to minimize the damage of the plurality of flexible films and the printed circuit board. Accordingly, the plurality of flexible films and the printed circuit board need to be designed such that a sum of the lengths of the plurality of flexible films and the length of the printed circuit board does not exceed the first length D1.

In contrast, referring to FIG. 10B, the roller 171 according to the exemplary embodiment is configured by the first flat portion 171Fa, the second flat portion 171Fb, and the curved portion 171R. When the display unit DP is wound, the plurality of flexible films 130 may be seated in the first flat portion 171Fa and the printed circuit board 140 may be seated in the second flat portion 171Fb. The first flat portion 171Fa and the second flat portion 171Fb may be formed so as not to interfere with the torsion spring TS in the roller 171.

When the first flat portion 171Fa and the second flat portion 171Fb are formed so as not to interfere with the torsion spring TS, the entire length of the first flat portion 171Fa and the second flat portion 171Fb may be a second length D2 which is larger than the first length D1. A length from one end of the plurality of flexible films 130 to the other end of the printed circuit board 140 may be equal to or smaller than the second length D2. The lengths of the plurality of flexible films 130 may be designed to be equal to or smaller than the length of the first flat portion 171Fa and the length of the printed circuit board 140 may be designed to be equal to or smaller than the second flat portion 171Fb.

In the roller 71' according to the comparative embodiment of FIG. 10A, only one flat portion 71F' is formed and in the roller 171 according to the exemplary embodiment of FIG. 10B, two flat portions, for example, the first flat portion 171Fa and the second flat portion 171Fb are formed. In this case, in the rollers 71' and 171 of FIGS. 10A and 10B, the flat portion 71F', the first flat portion 171Fa, and the second flat portion 171Fb may be formed so as not to interfere with the torsion spring TS' and TS. In order to avoid the interference with the torsion spring TS', it may be difficult for the roller 71' according to the comparative embodiment to extend the length of the flat portion 71F' to a predetermined level or more. In contrast, in the roller 171 according to the exemplary embodiment, two flat portions, that is, the first flat portion 171Fa and the second flat portion 171Fb are formed so that as compared with the comparative embodiment, the entire area of the flat portions 171Fa and 171Fb may be increased. Accordingly, as compared with the roller 71' according to the comparative embodiment, in the roller 171 according to the exemplary embodiment, the area in which the plurality of flexible films 130 and the printed circuit board 140 may be disposed may be improved.

Further, in the roller 71' according to the comparative embodiment, in order to ensure the area of the flat portion 71F' in which the plurality of flexible films and the printed circuit board of the related art are disposed, the plurality of flexible films and the printed circuit board may be designed to reduce the sizes of the plurality of flexible films and the printed circuit board. Further, the area of the flat portion 71F' may be improved by increasing a diameter of the roller 71'.

In contrast, in the roller 171 according to the exemplary embodiment, the first flat portion 171Fa and the second flat portion 171Fb are formed to easily ensure the area for disposing the plurality of flexible films 130 and the printed circuit board 140. Therefore, in the roller 171 according to the exemplary embodiment, the plurality of flexible films 130 and the printed circuit board 140 may be designed to reduce the sizes of the plurality of flexible films 130 and the printed circuit board 140. Further, the plurality of flexible films 130 and the printed circuit board 140 may be disposed without increasing the diameter of the roller 171.

Accordingly, in the display device 100 according to the exemplary embodiment of the present disclosure, two flat portions, that is, the first flat portion 171Fa and the second flat portion 171Fb are formed to improve the design margin of the plurality of flexible films 130 and the printed circuit board 140. As seen from FIGS. 10A and 10B, in the roller 171 according to the exemplary embodiment, two flat portions such as the first flat portion 171Fa and the second flat portion 171Fb are formed to ensure a sufficient space for seating the plurality of flexible films 130 and the printed circuit board 140 regardless of the restriction due to the torsion spring TS. Therefore, a redesign process for reducing the size of the plurality of flexible films 130 and the printed circuit board 140 may be simplified and the increase of the diameter of the roller 171 is also minimized so that the volume of the fully-wound display device 100 may be minimized. Accordingly, in the display device 100 according to the exemplary embodiment of the present disclosure, the first flat portion 171Fa in which the plurality of flexible films 130 is disposed and the second flat portion 171Fb in which the printed circuit board 140 is disposed are separately formed. As a result, a size of an area where the plurality of flexible films 130 and the printed circuit board 140 are disposed may be increased and the design margin of the plurality of flexible films 130 and the printed circuit board 140 may be ensured.

<Fastening of Display Device>

Figure 11A:
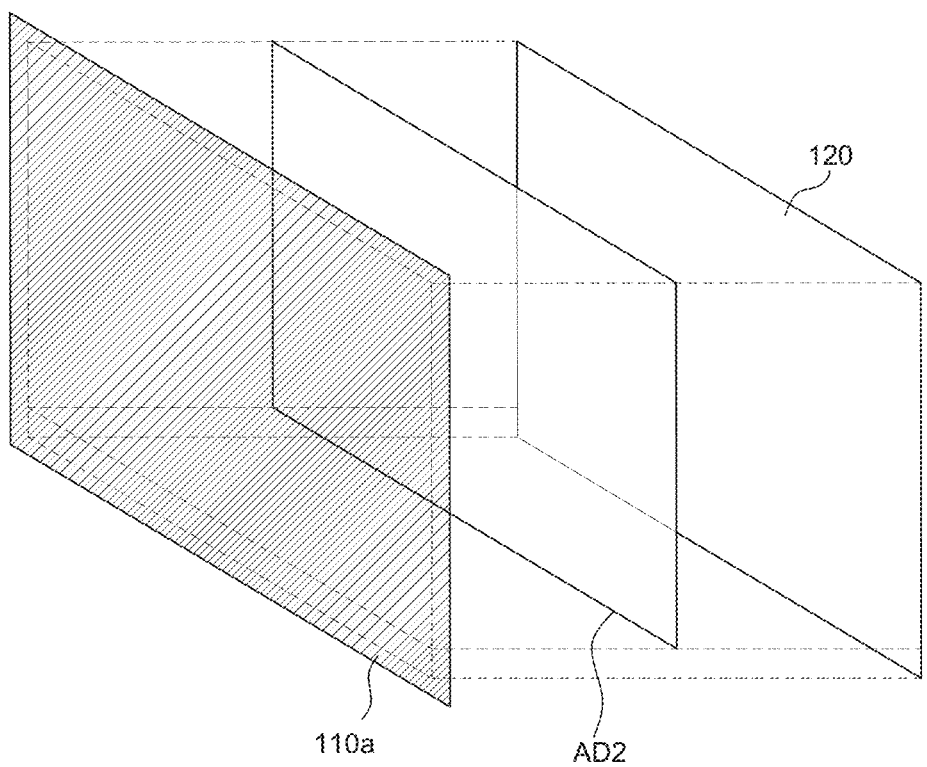
FIGS. 11A and 11B are perspective views illustrating the fastening of a first back cover and a display panel in a display device according to an exemplary embodiment of the present disclosure.
Figure 11B:
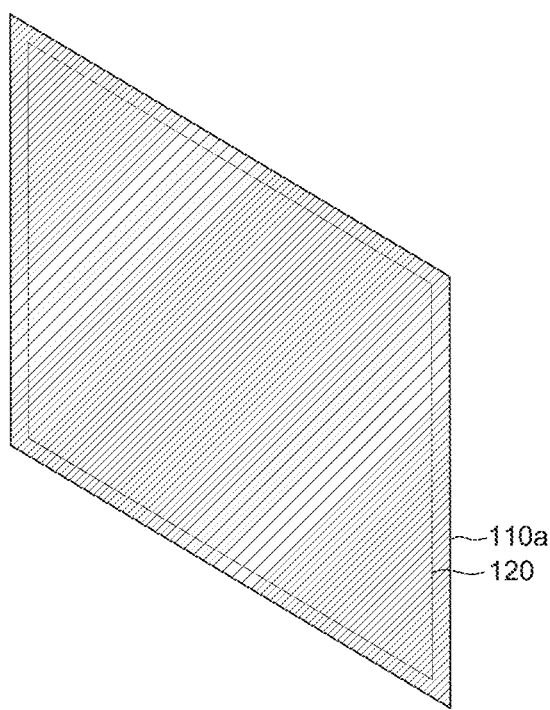

FIGS. 11A and 11B are perspective view illustrating the fastening of a first back cover and a display panel in a display device according to an exemplary embodiment of the present disclosure.

FIG. 11A illustrates a state before fastening the first back cover 110a and the display panel 120 and FIG. 11B illustrates a state after fastening the first back cover 110a and the display panel 120.

Referring to FIGS. 11A and 11B, when a screen direction in which an image is displayed is a right side, the first back cover 110a may be fastened with the display panel 120 from the left side.

In this case, even though it is not illustrated for the purpose of convenience, the plurality of flexible films 130 may be electrically connected to the display panel 120 on the rear surface. The rear surface of the display panel 120 may refer to an opposite surface to the screen direction. A driving IC such as a gate driver IC or a data driver IC may be disposed on the plurality of flexible films 130.

Further, the printed circuit board 140 may be connected to the plurality of flexible films 130. The printed circuit board 140 is a component which supplies signals to the driving IC. Various components may be disposed in the printed circuit board 140 to supply various signals such as a driving signal or a data signal to the driving IC.

As described above, when the plurality of flexible films 130 and the printed circuit board 140 are fastened on the rear surface of the display panel 120, it is referred to as reverse bonding.

In this case, a second adhesive layer AD2 may be interposed between the first back cover 110a and the display panel 120.

In the present disclosure, the second adhesive layer AD2 may not be applied to the routing line area and the pad area. According to the related art, the second adhesive layer is applied to the back cover and the front surface of the display panel so that when the back cover is wound around the roller, the display panel is wound around the roller. However, when the second adhesive layer AD2 is not applied to the routing line area and the pad area as described in the present disclosure, even though the first back cover 110a which matches the corresponding section is wound around the roller 171, a part of the display panel, that is, the routing line area and the pad area may be maintained to be flat.

The second adhesive layer AD2 may not be applied only to the lower end of the display area AA so that the routing line area and the pad area are not visible with naked eyes from the front surface.

The second adhesive layer AD2 may include a double sided adhesive tape.

Figure 12A:
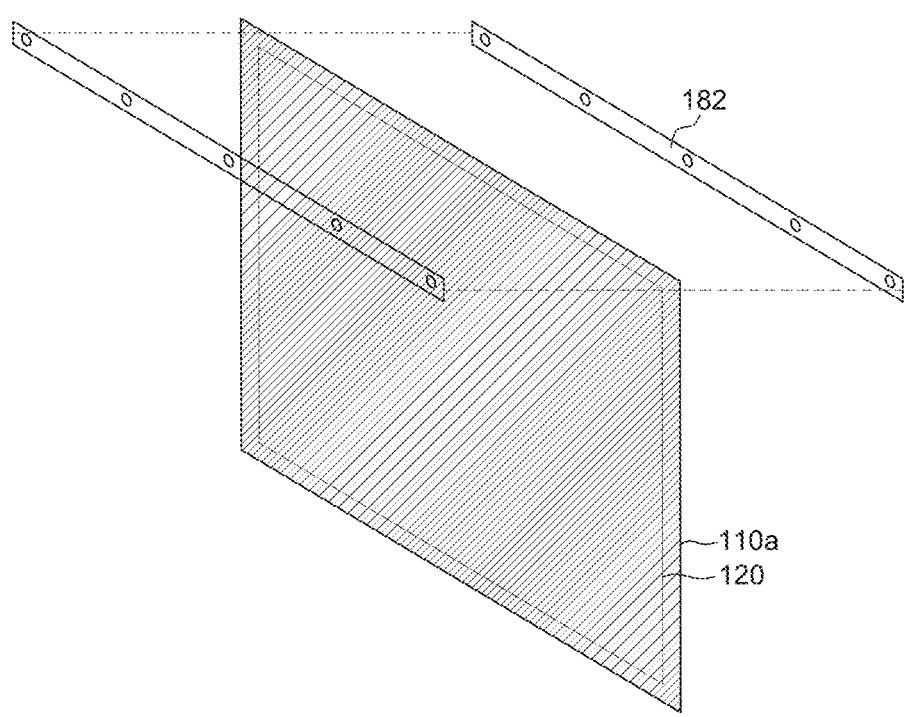
FIGS. 12A and 12B are perspective views illustrating the fastening of a first back cover and a head bar in a display device according to an exemplary embodiment of the present disclosure.
Figure 12B:
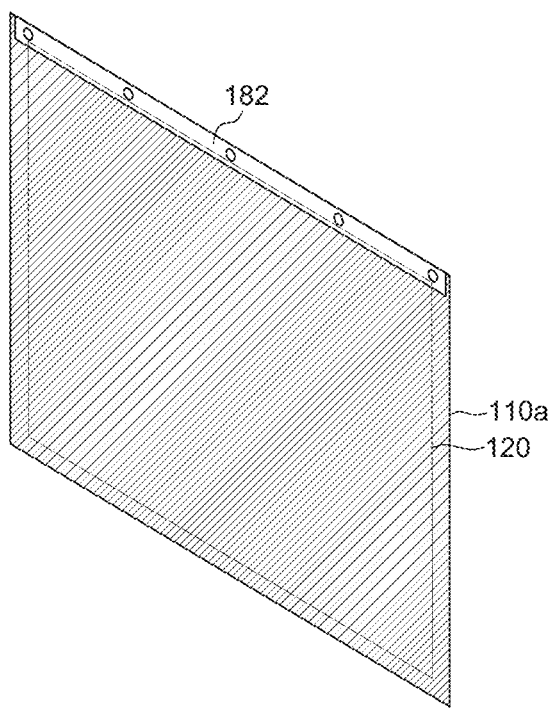

FIGS. 12A and 12B are perspective view illustrating the fastening of a first back cover and a head bar in a display device according to an exemplary embodiment of the present disclosure.

FIG. 12A illustrates a state before fastening the first back cover 110a and the head bar 182 and FIG. 12B illustrates a state after fastening the first back cover 110a and the head bar 182.

Referring to FIGS. 12A and 12B, after fastening the first back cover 110a with the display panel 120, the head bar 182 may be fastened with the upper end of the first back cover 110a.

The head bar 182 is coupled to the link unit 181 to move the display unit DP in the vertical direction in accordance with the rotation of the plurality of links 181a and 181b of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on the top surface of the display unit DP. The display unit DP and the head bar 182 may be fixed by a screw, but are not limited thereto.

Figure 13:
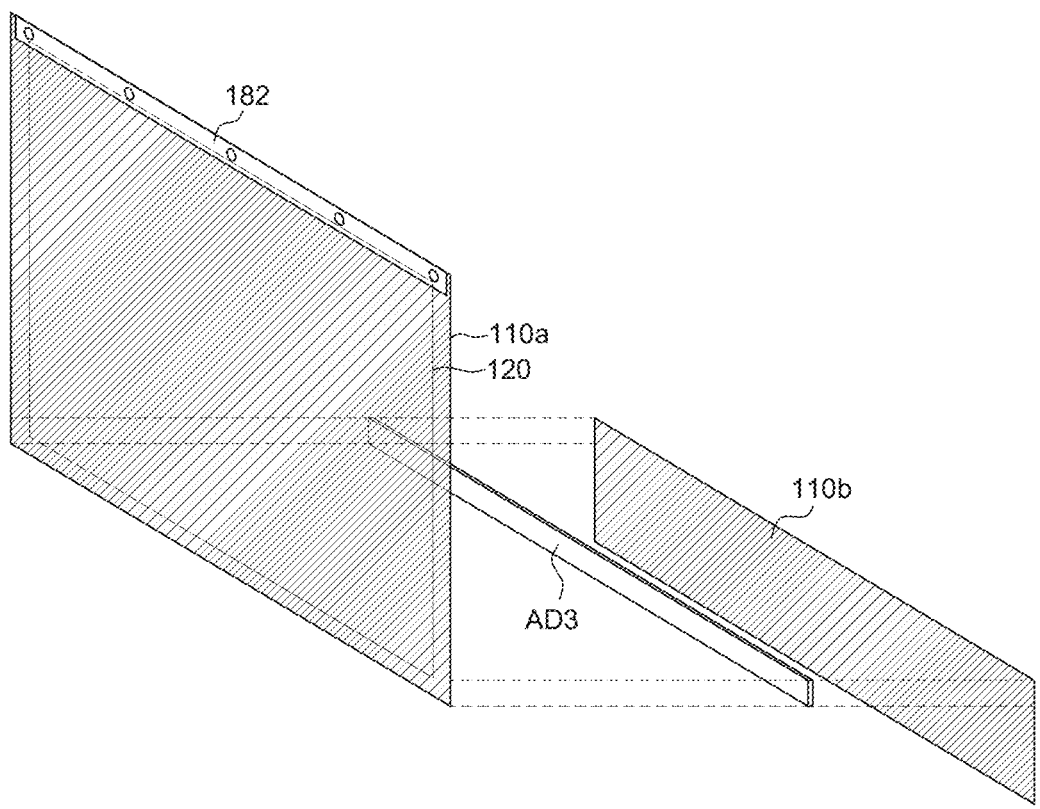
FIG. 13 is a perspective view illustrating the fastening of a second back cover and a display panel in a display device according to an exemplary embodiment of the present disclosure.

FIG. 13 is a perspective view illustrating the fastening of a second back cover and a display panel in a display device according to an exemplary embodiment of the present disclosure.

Referring to FIG. 13, after fastening the head bar 182 with an upper end of the first back cover 110a, the second back cover 110b may be fastened with a bezel area of a lower end of the display panel 120 by means of a third adhesive layer AD3.

The third adhesive layer AD3 may include a double sided adhesive tape.

The third adhesive layer AD3 may be applied to the routing line area and the pad area of the display panel 120.

Figure 14:
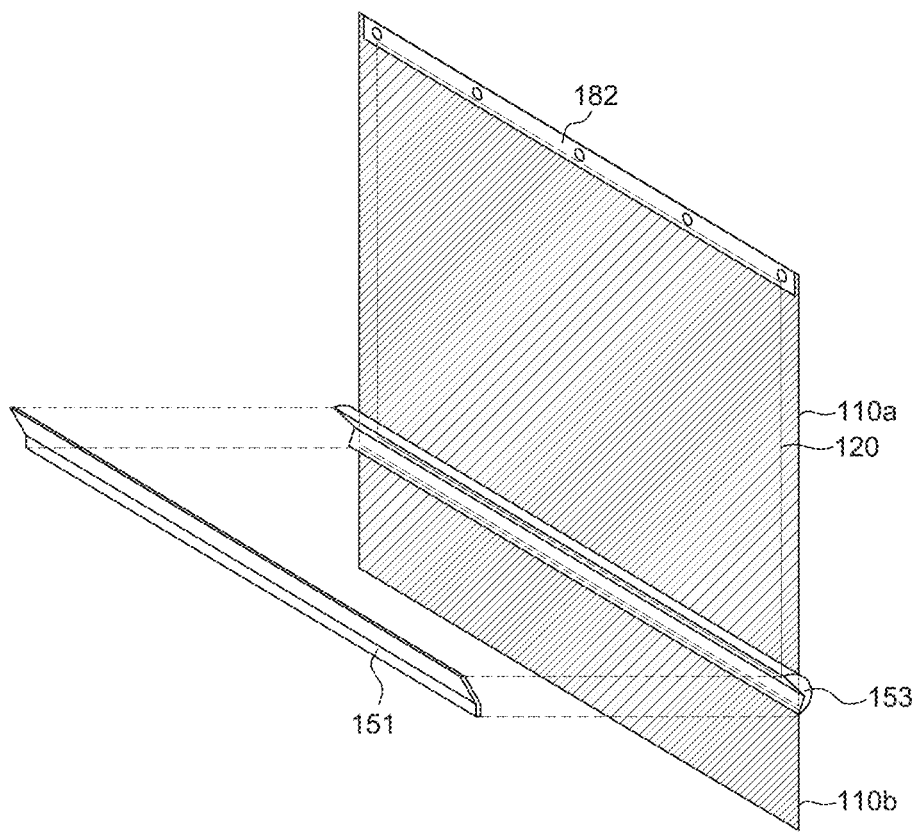
FIG. 14 is a perspective view illustrating the fastening of a second back cover and a display panel and a cover unit in a display device according to an exemplary embodiment of the present disclosure.

FIG. 14 is a perspective view illustrating the fastening of a second back cover and a display panel and a cover unit in a display device according to an exemplary embodiment of the present disclosure.

Referring to FIG. 14, after fastening the second back cover 110b with the display panel 120, the cover unit 150 may be fastened with the display panel 120 on the rear surface.

The cover unit 150 is disposed on the rear surface of the first back cover 110a rather than the front surface of the display panel 120 to implement the reverse-bonding of the flexible film 130 and the printed circuit board 140. The first back cover 110a supports only an area to the display area AA and the second back cover 110b supports an area from the routing line area at the lower end of the display area AA.

The cover unit 150 according to the present disclosure may include a base plate 151 and a cover plate 153.

The base plate 151 is bent with two levels to be disposed on the rear surface of the printed circuit board 140, that is, the first and second bottom surfaces 152a and 152b of the cover plate 153. The base plate 151 may be fixed to the cover plate 153 of the cover unit 150 on the rear surface of the first back cover 110a on which the display panel 120 is not disposed. Therefore, the base plate 151 of the cover unit 150 may support the printed circuit board 140 together with the cover plate 153. For example, the base plate 151 is formed of a material having a rigidity to support the printed circuit board 140 to be flat, but is not limited thereto.

The cover plate 153 is disposed on the rear surface of the first back cover 110a.

The cover plate 153 is disposed so as to cover the printed circuit board 140 disposed in the second malleable area MA2 of the first back cover 110a and may have a convex shape. That is, one surface of the cover plate 153 may be formed as a curved surface. The cover plate 153 is formed of a material having a rigidity to protect the printed circuit board 140, but is not limited thereto. The first and second bottom surfaces 152a and 152b of the cover plate 153 may configure a plain bent with two levels.

Further, the cover unit 150 maintains its original state without being bent when the display unit DP is wound to protect the plurality of flexible films 130 and the printed circuit board 140. Specifically, when the display unit DP is wound, the base plate 151 of the cover unit 150 having the rigidity maintains a flat state without being bent to protect the printed circuit board 140. Further, a part of the roller 171 around which the base plate 151 is wound may be formed as a flat surface so that the base plate 151 is not bent. For example, the roller 171 may be configured by a first flat portion 171Fa, a second flat portion 171Fb, and a curved portion 171R and the base plate 151 is bent with two levels to be seated on the first flat portion 171Fa and the second flat portion 171Fb, respectively. Therefore, even though the display unit DP is wound, the base plate 151 may be maintained to be flat without being bent.

Next, when the display unit DP is wound, the cover plate 153 of the cover unit 150 having the rigidity maintains an original convex shape without being deformed to protect the plurality of flexible films 130 and the printed circuit board 140. The cover plate 153 having a convex shape may form a circular shape together with the curved portion 171R of the roller 171. For example, the first and second bottom surfaces 152a and 152b of the base plate 151 having a convex shape configure a plane bent with two levels and are seated in the first flat portion 171Fa and the second flat portion 171Fb of the roller 171 corresponding thereto to form a substantially circular shape together with the curved portion 171R of the roller 171. Accordingly, the cover unit 150 and the roller 171 substantially form one circular shape and a part of the display panel 120 which is wound on the cover unit 150 is wound with a larger radius of curvature so that a stress applied to the display panel 120 may be reduced.

The cover unit of the present disclosure may be divided into two configurations, which will be described in more detail with reference to another exemplary embodiment of the present disclosure.

<Exemplary Embodiment in which Cover Unit is Divided>

Figure 15:
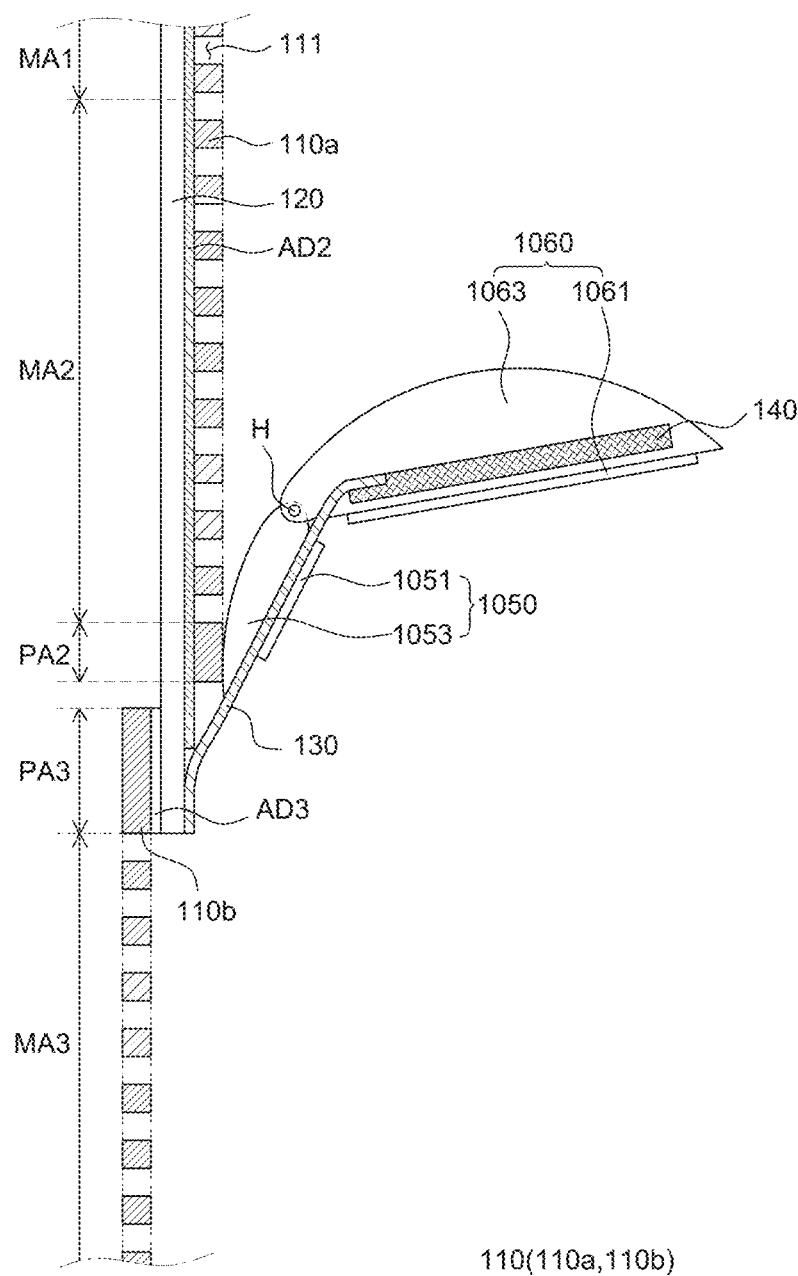
FIG. 15 is a cross-sectional view of a display device according to another exemplary embodiment of the present disclosure.

FIG. 15 is a cross-sectional view of a display device according to another exemplary embodiment of the present disclosure.

Only difference between the display device 1000 of FIG. 15 and the display device 100 of FIGS. 4 to 7 is a cover unit, but other configurations are substantially the same.

Referring to FIG. 15, the display unit DP includes a back cover 110, a display panel 120, a plurality of flexible films 130, a printed circuit board 140, and cover units 1050 and 1060.

The back cover 110 according to another exemplary embodiment of the present disclosure is disposed on a rear surface (and on a front surface of a part of a lower end) of the display panel 120 to support the display panel 120, the plurality of flexible films 130, and the printed circuit board 140.

A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120.

The back cover 110 includes a plurality of support areas PA and a plurality of malleable areas MA. The plurality of support areas PA is areas where a plurality of openings 111 is not disposed and the plurality of malleable areas MA is areas where a plurality of openings 111 is disposed.

The back cover 110 according to another exemplary embodiment of the present disclosure may include a first back cover 110a and a second back cover 110b. The back cover 110 according to another exemplary embodiment of the present disclosure may be configured to be divided into the first back cover 110a and the second back cover 110b. For example, the back cover 110 may be configured to be divided into the first back cover 110a which is disposed on a rear surface of the display panel 120 with respect to a lower end of the display panel 120 and the second back cover 110b which is disposed on a front surface of the display panel 120.

In this case, the first back cover 110a may be fastened with the head bar 182 and the second back cover 110b may be fastened with the roller 171.

The first back cover 110a includes a first support area PA1, a first malleable area MA1, a second support area PA2, and a second malleable area MA2, but is not limited thereto.

The second back cover 110b includes a third support area PA3, a third malleable area MA3, and a fourth support area PA4, but is not limited thereto.

Since the back cover 110 is wound or unwound in a column direction, the plurality of support areas PA and the plurality of malleable areas MA may be disposed along the column direction.

In the display device 1000 according to another exemplary embodiment of the present disclosure, the back cover 110 is configured by the first back cover 110a and the second back cover 110b which are separated to form the back cover 110 so as to correspond to various sizes of the display panel 120. Accordingly, the first back cover 110a and the second back cover 110b may perform all the functions of the back cover 110 of the related art and the back cover 110 may be manufactured to be smaller so that the productivity of the back cover 110 may be improved.

In the first support area PA1, the second support area PA2, the third support area PA3, and the fourth support area PA4, the plurality of openings 111 as formed in the plurality of malleable areas MA is not formed. Specifically, the first fastening holes AH1 are formed in the first support area PA1 and the second fastening holes AH2 are formed in the fourth support area PA4, but the plurality of openings 111 as formed in the plurality of malleable areas MA is not formed in the first support area PA1, the second support area PA2, the third support area PA3, and the fourth support area PA4. Further, the first fastening holes AH1 and the second fastening holes AH2 have different shapes from that of the plurality of openings 111. The first support area PA1 is an area fixed to the head bar 182, the second support area PA2 and the third support area PA3 are areas where the flexible films 130 are supported, and the fourth support area PA4 is an area fixed to the roller 171. Therefore, the support areas may have a rigidity larger than that of the plurality of malleable areas MA.

As the first support area PA1, the second support area PA2, the third support area PA3, and the fourth support area PA4 have the rigidity, the first support area PA1 and the fourth support area PA4 may be firmly fixed to the head bar 182 and the roller 171. Further, the second support area PA2 and the third support area PA3 maintain the plurality of flexible films 130 to be flat so as not to be bent, thereby protecting the plurality of flexible films 130. Therefore, the display unit DP is fixed to the roller 171 and the head bar 182 of the driving unit MP to move to the inside or the outside of the housing unit HP according to the movement of the driving unit MP and protect the plurality of flexible films 130 and the printed circuit board 140.

Referring to FIG. 15, the display panel 120 may be disposed on one surface of the first back cover 110a. For example, the display panel 120 is disposed in the first malleable area MA1, on one surface of the first back cover 110a.

The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120.

Since the display device 1000 according to another exemplary embodiment of the present disclosure is a rollable display device, the display panel 120 may be implemented as a flexible display panel to be wound around or unwound from the roller 171.

The second adhesive layer AD2 is disposed between the display panel 120 and the first back cover 110a. The second adhesive layer AD2 may bond the display panel 120 and the first back cover 110a to each other. The second adhesive layer AD2 is formed of a material having adhesiveness and may be a thermosetting or natural curing adhesive.

The second adhesive layer AD2 may not be applied to the pad area to which the plurality of flexible films 130 is attached. The third support area PA3 of the second back cover 110b may be attached to a lower side of the display panel 120 by means of the third adhesive layer AD3.

The second adhesive layer AD2 and the third adhesive layer AD3 may include a double sided adhesive tape.

Referring to FIG. 15, a plurality of flexible films 130 may be disposed in the second support area PA2 of the first back cover 110a. One ends of the plurality of flexible films 130 are disposed in the non-display area NA of the display panel 120 to supply a power voltage, a data voltage, or the like to the plurality of sub pixels and the driving circuits of the display area AA.

Further, the printed circuit board 140 is disposed in the second malleable area MA2 of the first back cover 110a to be coupled to the plurality of flexible films 130.

The display unit DP according to the present disclosure may include cover units 1050 and 1060.

The cover units 1050 and 1060 according to another exemplary embodiment of the present disclosure are configured to be divided into a first cover unit 1060 and a second cover unit 1050. Further, the cover units 1050 and 1060 according to another exemplary embodiment of the present disclosure are disposed on the rear surface of the first back cover 110a rather than the front surface of the display panel 120 to implement the reverse-bonding of the flexible film 130. The first back cover 110a supports only an area to the display area AA and the second back cover 110b supports an area from the routing line area at the lower end of the display area AA.

That is, according to the present disclosure, in the large-sized rollable display device 1000, the position of the cover units 1050 and 1060 is changed, and, at the same time, the fastening position of the plurality of flexible films 130 and the printed circuit board 140 is changed to fix the plurality of flexible films 130.

According to the present disclosure, the cover units 1050 and 1060 are disposed on the rear surface of the first back cover 110a, the first back cover 110a supports only an area to the display area AA of the display panel 120 and the second back cover 110b supports an area from the routing line area at the lower end of the display area AA. Therefore, the reverse-bonding of the flexible film 130 can be implemented and the spring back effect caused when the end of the display panel is rolled may be lowered. That is, the cover units 1050 and 1060 are fixed on the rear surface of the first back cover 110a and the flexible film 130 may be fixed in the cover units 1050 and 1060 after being reversibly bonded. As a result, the display panel 120 may be maintained to be flat even during the repeated winding and unwinding and the plurality of flexible films 130 maintains the same shape so that the crack of the pad area due to the tension of the flexible film 130 may be improved.

Further, according to the present disclosure, outer circumferential surfaces of the first cover unit 1060 and the second cover unit 1050 configure an arc and bottom surfaces configure a flat plane to correspond to the second flat portion 171Fb and the first flat portion 171Fa of the roller 171.

Further, the first cover unit 1060 and the second cover unit 1050 of the present disclosure are disposed in the second malleable area MA2 of the first back cover 110a to accommodate a part of the plurality of flexible films 130 and the printed circuit board 140. The first cover unit 1060 and the second cover unit 1050 of the present disclosure accommodate and protect the plurality of flexible films 130 and the printed circuit board 140.

The first cover unit 1060 of the present disclosure may be partially fastened on the rear surface of the second support area PA2 of the first back cover 110a to be fixed, but is not limited thereto. To this end, the third fastening hole may be formed in the second support area PA2 of the first back cover 110a. The first cover unit 1060 may be fastened with the first back cover 110a by means of the third fastening hole.

The second cover unit 1050 of the present disclosure may include a second base plate 1051 and a second cover plate 1053.

The second base plate 1051 is configured by a planar flat surface to be disposed on the rear surface of the plurality of flexible films 130, that is, on a bottom surface of the second cover plate 1053. The second base plate 1051 may be fixed to the second cover plate 1053 of the second cover unit 1050 on the rear surface of the first back cover 110a. Accordingly, the second base plate 1051 of the second cover unit 1050 may support the plurality of flexible films 130 together with the second cover plate 1053. For example, the second base plate 1051 is formed of a material having a rigidity to support the plurality of flexible films 130 to be flat, but is not limited thereto.

The second cover plate 1053 is disposed on the rear surface of the first back cover 110a.

The second cover plate 1053 is disposed so as to cover the plurality of flexible films 130 disposed in the second support area PA2 of the first back cover 110a and may have a convex shape. That is, one surface of the second cover plate 1053 may be formed as a curved surface. The second cover plate 1053 is formed of a material having a rigidity to protect the flexible films 130, but is not limited thereto. The bottom surface of the second cover plate 1053 may configure a flat plane.

The first cover unit 1060 of the present disclosure may include a first base plate 1061 and a first cover plate 1063.

The first base plate 1061 is configured by a planar flat surface to be disposed on the rear surface of the printed circuit board 140, that is, on a bottom surface of the first cover plate 1063. The first base plate 1061 may be fixed to the first cover plate 1063 of the first cover unit 1060 on the rear surface of the first back cover 110a. Accordingly, the first base plate 1061 of the first cover unit 1060 may support the printed circuit board 140 together with the first cover plate 1063. For example, the first base plate 1061 is formed of a material having a rigidity to support the printed circuit board 140 to be flat but is not limited thereto.

The first cover plate 1063 is disposed on the rear surface of the first back cover 110a.

The first cover plate 1063 is disposed so as to cover the printed circuit board 140 disposed in the second malleable area MA2 of the first back cover 110a and has a convex shape. That is, one surface of the first cover plate 1063 may be formed as a curved surface. The first cover plate 1063 is formed of a material having a rigidity to protect the printed circuit board 140 but is not limited thereto. The bottom surface of the first cover plate 1063 may configure a flat plane.

The second cover plate 1053 and the first cover plate 1063 may be coupled to each other. For example, a plurality of fixing holes H which passes through the second cover plate 1053 and the first cover plate 1063 is formed therein and a fastening member such as a screw is fastened therewith through the plurality of fixing holes H so that the second cover plate 1053 and the first cover plate 1063 are coupled to each other.

However, the second cover plate 1053 and the first cover plate 1063 may be coupled to each other in various manners and are not limited thereto.

The cover units 1050 and 1060 according to another exemplary embodiment of the present disclosure is configured to be divided into the first cover unit 1060 and the second cover unit 1050 so that when the display unit DP is wound around the roller 171, the cover units may maintain its original state without being bent. Therefore, the plurality of flexible films 130 and the printed circuit board 140 may be protected better.

The roller according to the present disclosure may be configured to include only one flat portion, and, in this case, the bottom surface of the cover unit may be configured by one flat surface, which will be described below in more detail with reference to another exemplary embodiment of the present disclosure.

<Exemplary Embodiment in which Roller has Only One Flat Portion>

Figure 16:
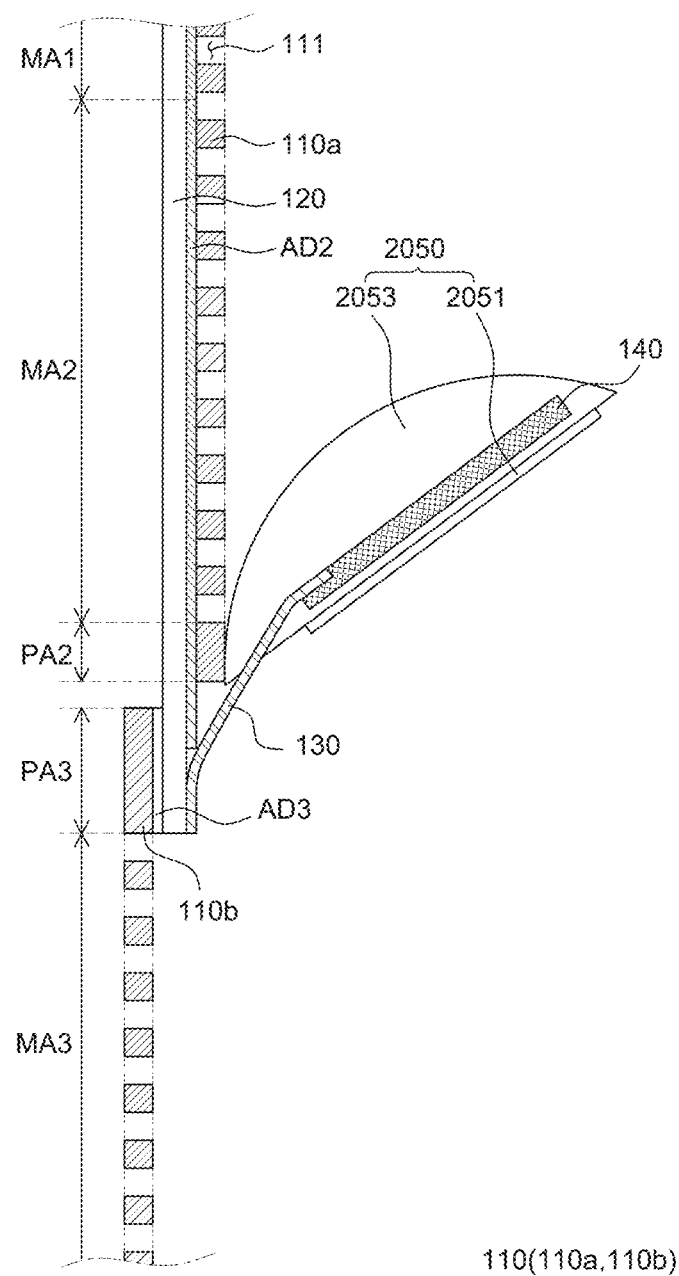
FIG. 16 is a cross-sectional view of a display device according to still another exemplary embodiment of the present disclosure.

FIG. 16 is a cross-sectional view of a display device according to still another exemplary embodiment of the present disclosure.

FIGS. 17A to 17D are cross-sectional views of a fastening process of a display device according to still another exemplary embodiment of the present disclosure.

Only difference between the display device 2000 of FIG. 16 and FIGS. 17A to 17D and the above-described display device 100 according to the exemplary embodiment of the present disclosure of FIGS. 4 to 7 is a roller and a cover unit, but other configurations are substantially the same.

Figure 17A:
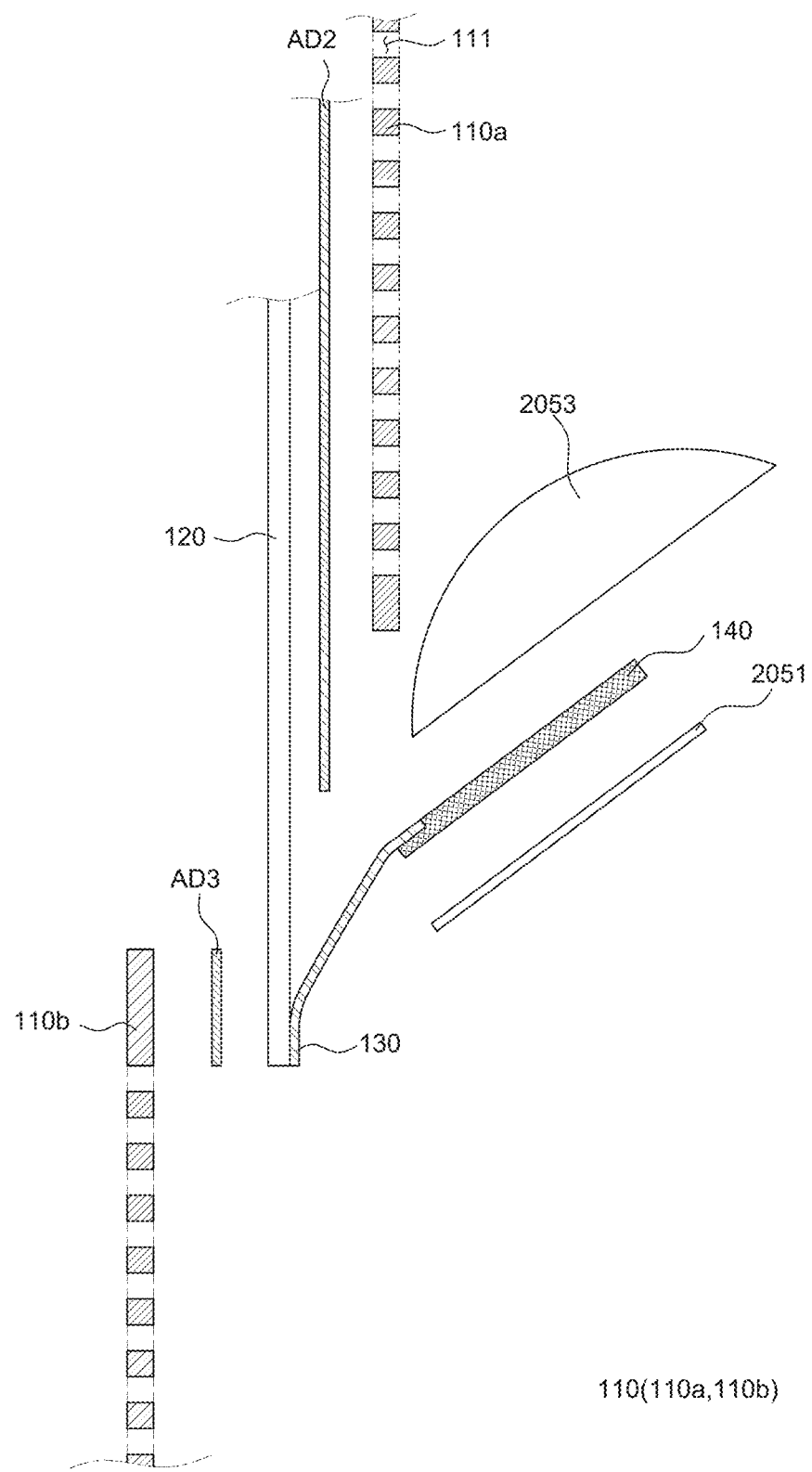
FIGS. 17A to 17D are cross-sectional views of a fastening process of a display device according to still another exemplary embodiment of the present disclosure.
Figure 17B:
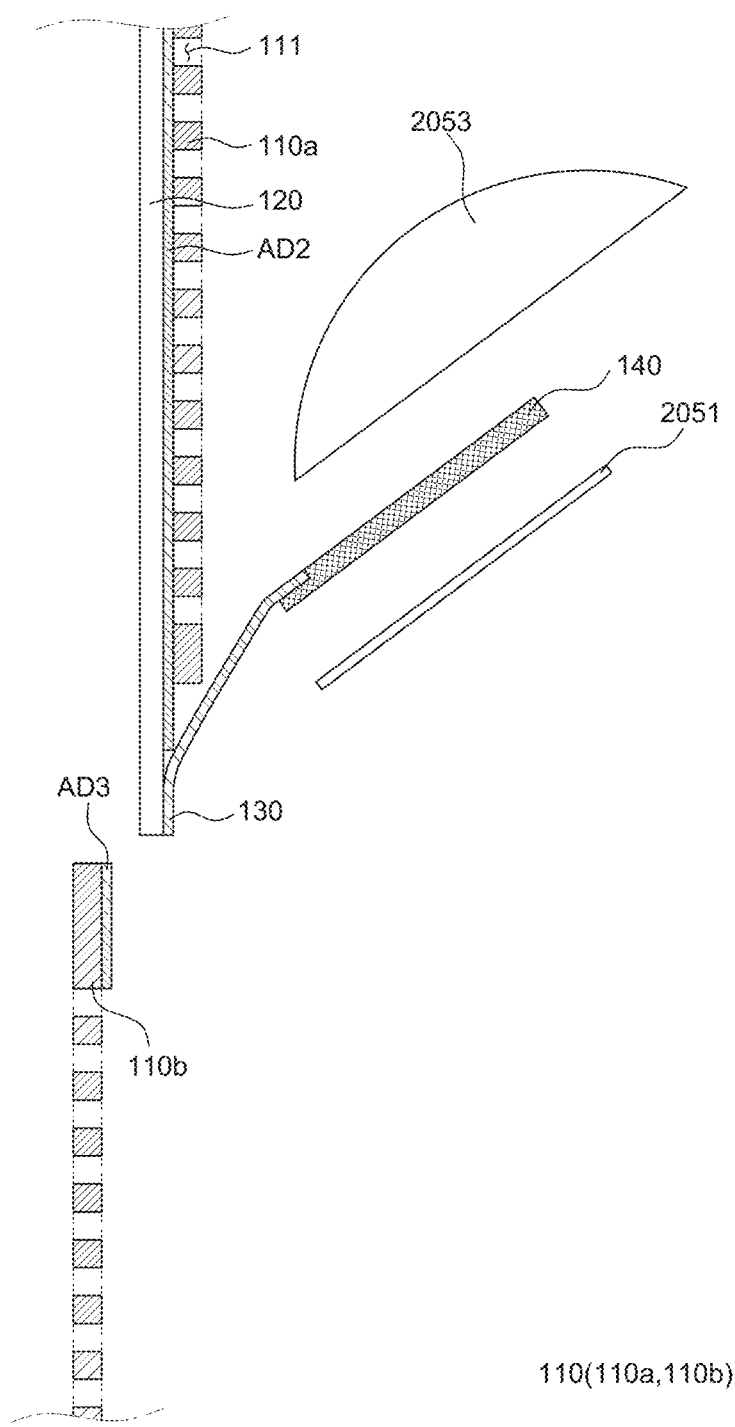
Figure 17C:
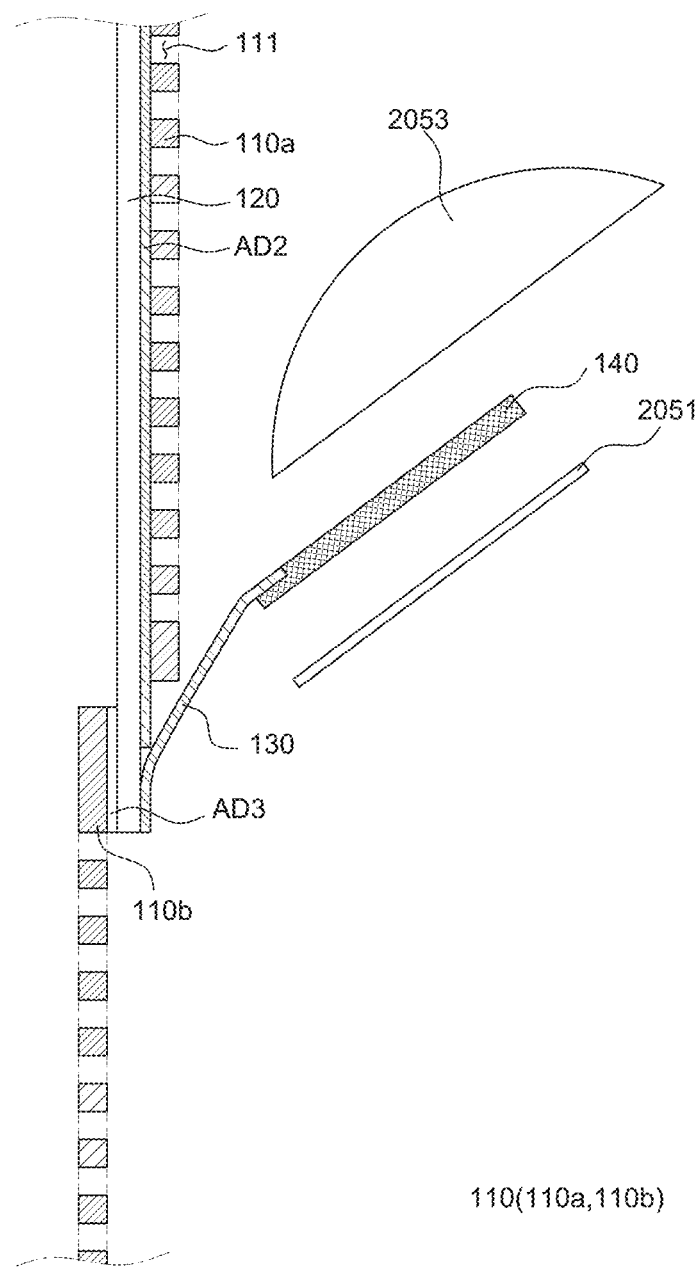
Figure 17D:
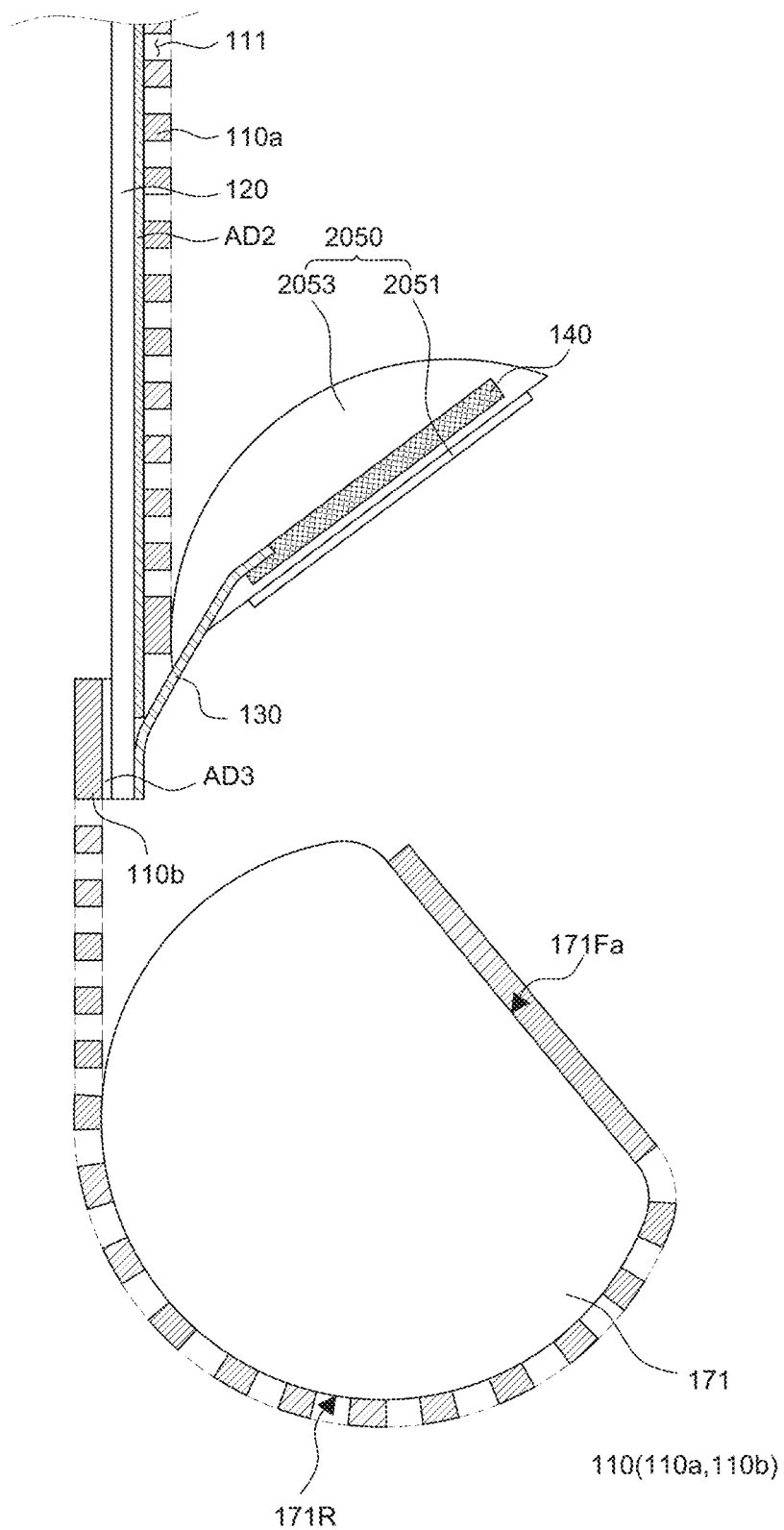

FIG. 17A illustrates a state of a first back cover 110*a*, a second back cover 110*b*, a display panel 120, and a cover unit 2050 according to still another exemplary embodiment of the present disclosure before being fastened with each other. Further, FIG. 17B illustrates a state in which the first back cover 110*a*, the second back cover 110*b*, and the display panel 120 are fastened with each other. Further, FIG. 17C illustrates a state in which the first back cover 110*a*, the second back cover 110*b*, the display panel 120, and the cover unit 2050 have been fastened with each other. Further, FIG. 17D illustrates a state in which the roller 2071 is fastened with the second back cover 110*b*.

Referring to FIG. 16 and FIGS. 17A to 17D, the display unit DP according to still another exemplary embodiment of the present disclosure includes a back cover 110, a display panel 120, a plurality of flexible films 130, a printed circuit board 140, and a cover unit 2050.

As the same as described above, the back cover 110 according to still another exemplary embodiment of the present disclosure is disposed on a rear surface (and on an entire surface of a part of a lower end) of the display panel 120 to support the display panel 120, the plurality of flexible films 130, and the printed circuit board 140.

A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120.

The back cover 110 includes a plurality of support areas PA and a plurality of malleable areas MA. The plurality of support areas PA is areas where a plurality of openings 111 is free from being disposed and the plurality of malleable areas MA is areas where a plurality of openings 111 is disposed.

The back cover 110 according to still another exemplary embodiment of the present disclosure may include a first back cover 110*a* and a second back cover 110*b*. That is, the back cover 110 according to still another exemplary embodiment of the present disclosure may be configured to be divided into the first back cover 110*a* and the second back cover 110*b*. For example, the back cover 110 according to still another exemplary embodiment of the present disclosure may be configured to be divided into the first back cover 110*a* which is disposed on a rear surface of the display panel 120 with respect to a lower end of the display panel 120 and the second back cover 110*b* which is disposed on a front surface of the display panel 120.

In this case, the first back cover 110*a* may be fastened with the head bar 182 and the second back cover 110*b* may be fastened with the roller 2071.

The first back cover 110*a* includes a first support area PA1, a first malleable area MA1, a second support area PA2, and a second malleable area MA2, but is not limited thereto.

The second back cover 110*b* includes a third support area PA3, a third malleable area MA3, and a fourth support area PA4, but is not limited thereto.

Since the back cover 110 is wound or unwound in a column direction, the plurality of support areas PA and the plurality of malleable areas MA may be disposed along the column direction.

In the display device 2000 according to still another exemplary embodiment of the present disclosure, the back cover 110 is configured by the first back cover 110*a* and the second back cover 110*b* which are separated to form the back cover 110 so as to correspond to various sizes of the display panel 120. Further, the back cover 110 may be manufacture to have a smaller size so that the productivity of the back cover 110 may be improved.

Referring to FIGS. 16 and 17A to 17D, the display panel 120 may be disposed on one surface of the first back cover 110*a*. For example, the display panel 120 may be disposed in the first malleable area MA1, on one surface of the first back cover 110*a*.

The second adhesive layer AD2 is disposed between the display panel 120 and the first back cover 110*a*. The second adhesive layer AD2 may bond the display panel 120 and the first back cover 110*a* to each other. The second adhesive layer AD2 is formed of a material having adhesiveness and may be a thermosetting or natural curing adhesive.

The second adhesive layer AD2 may not be applied to the pad area to which the plurality of flexible films 130 is attached. The third support area PA3 of the second back cover 110*b* may be attached to a lower side of the display panel 120 by means of the third adhesive layer AD3.

The second adhesive layer AD2 and the third adhesive layer AD3 may include a double sided adhesive tape.

A plurality of flexible films 130 is disposed in the second support area PA2 of the first back cover 110*a*.

Further, the printed circuit board 140 is disposed in the second malleable area MA2 of the first back cover 110*a* to be coupled to the plurality of flexible films 130.

Referring to FIGS. 16 and 17A to 17D, the display unit DP according to the present disclosure may include the cover unit 2050.

The cover portion 2050 according to still another exemplary embodiment of the present disclosure is disposed on the rear surface of the first back cover 110*a*, rather than a front surface of the display panel 120 in order to implement reverse bonding of the flexible film 130.

That is, according to the present disclosure, in the large-sized rollable display device 2000, the position of the cover unit 2050 is changed, and, at the same time, the fastening position of the plurality of flexible films 130 and the printed circuit board 140 is changed to fix the plurality of flexible films 130.

Accordingly, according to the present disclosure, the cover unit 2050 is disposed on the rear surface of the first back cover 110*a*, the first back cover 110*a* supports only an area to the display area AA of the display panel 120 and the second back cover 110b supports an area from the routing line area at the lower end of the display area AA. Therefore, the reverse-bonding of the flexible film 130 can be implemented and the spring back effect caused when the end of the display panel 120 is rolled may be lowered. That is, the cover unit 2050 is fixed to the rear surface of the first back cover 110a and the flexible film 130 may be fixed in the cover unit 2050 after being reversibly bonded. As a result, the display panel 120 may be maintained to be flat even during the repeated winding and unwinding and the plurality of flexible films 130 maintains the same shape so that the crack of the pad area due to the tension of the flexible film 130 may be improved.

Further, according to the present disclosure, an outer circumferential surface of the cover unit 2050 configures an arc and the bottom surface configures a planar flat surface to correspond to the flat portion 2071F of the roller 2071. That is, the bottom surface of the cover unit 2050 according to another exemplary embodiment of the present disclosure may be configured by a flat plane corresponding to the flat portion 2071F of the roller 2071.

The cover unit 2050 of the present disclosure is disposed in the second support area PA2 and the second malleable area MA2 of the first back cover 110a to accommodate a part of the plurality of flexible films 130 and the printed circuit board 140. The cover unit 2050 of the present disclosure accommodates the printed circuit board 140 to protect the printed circuit board 140.

A part of the cover unit 2050 of the present disclosure may be fastened with the rear surface of the second support area PA2 of the first back cover 110a to be fixed, but is not limited thereto. To this end, the third fastening hole may be formed in the second support area PA2 of the first back cover 110a. The cover unit 2050 may be fastened with the first back cover 110a by means of the third fastening hole.

The cover unit 2050 according to another exemplary embodiment of the present disclosure may include a base plate 2051 and a cover plate 2053.

The base plate 2051 is configured by a planar flat surface to be disposed on the rear surface of the printed circuit board 140, that is, on a bottom surface of the cover plate 2053. The base plate 2051 may be fixed to the cover plate 2053 of the cover unit 2050 on the rear surface of the first back cover 110a. Therefore, the base plate 2051 of the cover unit 2050 may support the printed circuit board 140 together with the cover plate 2053. For example, the base plate 2051 is formed of a material having a rigidity to support the printed circuit board 140 to be flat, but is not limited thereto.

The cover plate 2053 is disposed on the rear surface of the first back cover 110a.

The cover plate 2053 is disposed so as to cover the printed circuit board 140 disposed in the second malleable area MA2 of the first back cover 110a and has a convex shape. That is, one surface of the cover plate 2053 may be formed as a curved surface. The cover plate 2053 is formed of a material having a rigidity to protect the printed circuit board 140, but is not limited thereto. The bottom surface of the cover plate 2053 may configure a flat plane.

Further, the cover unit 2050 maintains its original state without being bent when the display unit DP is wound to protect the plurality of flexible films 130 and the printed circuit board 140. Specifically, when the display unit DP is wound, the base plate 2051 of the cover unit 2050 having the rigidity maintains a flat state without being bent to protect the printed circuit board 140. Further, a part of the roller 2071 around which the base plate 2051 is wound may be formed as a flat surface so that the base plate 2051 is not bent. For example, the roller 2071 may be configured by the flat portion 2071F and the curved portion 2071R and the base plate 2051 is seated on the flat portion 2071F of the roller 2071. Therefore, even though the display unit DP is wound, the base plate 2051 may be maintained to be flat without being bent.

Next, when the display unit DP is wound, the cover plate 2053 of the cover unit 2050 having the rigidity maintains an original convex shape without being deformed to protect the plurality of flexible films 130 and the printed circuit board 140. Further, the cover plate 2053 having a convex shape may form a circular shape together with the curved portion 2071R of the roller 2071. For example, the bottom surface of the base plate 2051 having a convex shape configures a flat plane and is seated on the corresponding flat portion 2071F of the roller 2071 to form a substantially circular shape together with the curved portion 2071R of the roller 2071. Accordingly, the cover unit 2050 and the roller 2071 substantially form one circular shape and a part of the display panel 120 which is wound on the cover unit 2050 is wound with a larger radius of curvature so that a stress applied to the display panel 120 may be reduced.

The exemplary embodiments of the present disclosure can also be described as follows:

According to an aspect of the present disclosure, there is provided a display device. The display device includes a display panel, a first back cover which supports the display panel on a rear surface of the display panel, at least one flexible film which is electrically connected to a lower end of the rear surface of the display panel and is disposed on a rear surface of the first back cover, a printed circuit board which is electrically connected to the flexible film and disposed on the rear surface of the first back cover, a cover unit which accommodates the flexible film and the printed circuit board on the rear surface of the first back cover and a roller around which the display panel and the first back cover are wound or unwound.

The display device may further include a second back cover which supports a lower end of the display panel on a front surface of the display panel.

The display device may further include a first adhesive layer which is interposed between the display panel and the first back cover to bond the display panel and the first back cover.

The first adhesive layer may be not disposed on a lower end of the rear surface of the display panel to which the flexible film is attached.

The display device may further include a second adhesive layer which is interposed between the display panel and the second back cover to bond the display panel and the second back cover.

The first back cover may be attached to a display area of the display panel to support the display panel and the second back cover may be attached from a wiring line area at a lower end of the display area to support the display panel.

The roller may have a cylindrical shape in which a part of an outer circumferential surface is configured by a first flat portion and a second flat portion and the remaining part of the outer circumferential surface is configured by a curved portion.

The cover unit may include a cover plate in which one surface has a convex shape and the other surface configures first and second bottom surfaces to correspond to the first and second flat portions of the roller and a base plate which includes first and second flat surfaces and is attached so as to correspond to the first and second bottom surfaces of the cover plate.

The flexible film and the printed circuit board may be disposed between the base plate and the cover plate.

The at least one flexible film may correspond to the second bottom surface of the cover plate and the printed circuit board may correspond to the first bottom surface of the cover plate.

The cover unit may include a first cover unit and a second cover unit.

The first cover unit may include a first cover plate in which one surface has a convex shape and a first bottom surface configures a plane to correspond to the first flat portion of the roller and a first base plate disposed to correspond to the first bottom surface of the first cover plate.

The second cover unit may include a second cover plate in which one surface has a convex shape and a second bottom surface configures a plane to correspond to the second flat portion of the roller and a second base plate disposed to correspond to the second bottom surface of the second cover plate.

The printed circuit board may be located between the first base plate and the first cover plate and the flexible film may be located between the second base plate and the second cover plate.

A fixing hole which passes through the first cover plate and the second cover plate may be formed and a fastening member may be fastened through the fixing hole so that the first cover plate and the second cover plate are interworked.

The roller may have a cylindrical shape in which a part of an outer circumferential surface is configured by one flat portion and the remaining part of the outer circumferential surface may be configured by a curved portion.

The cover unit may include a cover plate in which one surface has a convex shape and a bottom surface configures a plane to correspond to the flat portion of the roller and a base plate disposed to correspond to the bottom surface of the cover plate.

The flexible film and the printed circuit board may be disposed between the base plate and the cover plate.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a first back cover which supports the display panel on a rear surface of the display panel;
   at least one flexible film which is electrically connected to a lower end of the rear surface of the display panel and is disposed on a rear surface of the first back cover;
   a printed circuit board which is electrically connected to the flexible film and disposed on the rear surface of the first back cover;
   a cover unit which accommodates the flexible film and the printed circuit board on the rear surface of the first back cover; and
   a roller around which the display panel and the first back cover are wound or unwound,
   wherein the roller has a cylindrical shape in which a part of an outer circumferential surface is configured by a first flat portion and a second flat portion and the remaining part of the outer circumferential surface is configured by a curved portion, and
   wherein first and second bottom surfaces of the cover unit configure a plane which is bent with two levels to correspond to the first and second flat portions of the roller.

2. The display device according to claim 1, further comprising:
   a second back cover which supports a lower end of the display panel on a front surface of the display panel.

3. The display device according to claim 2, further comprising:
   a second adhesive layer which is interposed between the display panel and the second back cover to bond the display panel and the second back cover.

4. The display device according to claim 2, wherein the first back cover is attached to a display area of the display panel to support the display panel and the second back cover is attached to a wiring line area at a lower end of the display area to support the display panel.

5. The display device according to claim 1, further comprising:
   a first adhesive layer which is interposed between the display panel and the first back cover to bond the display panel and the first back cover.

6. The display device according to claim 5, wherein the first adhesive layer is free from being disposed on a lower end of the rear surface of the display panel to which the flexible film is attached.

7. The display device according to claim 1, wherein the cover unit includes:
   a cover plate in which one surface has a convex shape and the other surface configures the first and second bottom surfaces; and
   a base plate which includes first and second flat surfaces and is attached so as to correspond to the first and second bottom surfaces of the cover plate.

8. The display device according to claim 7, wherein the flexible film and the printed circuit board are disposed between the base plate and the cover plate.

9. The display device according to claim 7, wherein the at least one flexible film corresponds to the second bottom surface of the cover plate and the printed circuit board corresponds to the first bottom surface of the cover plate.

10. A display device, comprising:
    a display panel;
    a first back cover which supports the display panel on a rear surface of the display panel;
    at least one flexible film which is electrically connected to a lower end of the rear surface of the display panel and is disposed on a rear surface of the first back cover;
    a printed circuit board which is electrically connected to the flexible film and disposed on the rear surface of the first back cover;
    a cover unit which accommodates the flexible film and the printed circuit board on the rear surface of the first back cover; and
    a roller around which the display panel and the first back cover are wound or unwound,
    wherein the roller has a cylindrical shape in which a part of an outer circumferential surface is configured by a first flat portion and a second flat portion and the remaining part of the outer circumferential surface is configured by a curved portion,
    wherein the cover unit includes a first cover unit and a second cover unit, and
    wherein the first cover unit includes:

a first cover plate in which one surface has a convex shape and a first bottom surface configures a plane to correspond to the first flat portion of the roller; and a first base plate disposed to correspond to the first bottom surface of the first cover plate.

11. The display device according to claim 10, wherein the second cover unit includes:

a second cover plate in which one surface has a convex shape and a second bottom surface configures a plane to correspond to the second flat portion of the roller; and a second base plate disposed to correspond to the second bottom surface of the second cover plate.

12. The display device according to claim 11, wherein the printed circuit board is located between the first base plate and the first cover plate and the flexible film is located between the second base plate and the second cover plate.

13. The display device according to claim 11, wherein a fixing hole which passes through the first cover plate and the second cover plate is formed and a fastening member is fastened through the fixing hole so that the first cover plate and the second cover plate are interworked.

14. A display device, comprising:

a display panel;

a first back cover which supports the display panel on a rear surface of the display panel;

at least one flexible film which is electrically connected to a lower end of the rear surface of the display panel and is disposed on a rear surface of the first back cover;

a printed circuit board which is electrically connected to the flexible film and disposed on the rear surface of the first back cover;

a cover unit which accommodates the flexible film and the printed circuit board on the rear surface of the first back cover; and a roller around which the display panel and the first back cover are wound or unwound, wherein the roller has a cylindrical shape in which a part of an outer circumferential surface is configured by one flat portion and the remaining part of the outer circumferential surface is configured by a curved portion, and wherein the cover unit includes:

a cover plate in which one surface has a convex shape and a bottom surface configures a plane to correspond to the flat portion of the roller; and a base plate disposed to correspond to the bottom surface of the cover plate.

15. The display device according to claim 14, wherein the flexible film and the printed circuit board are disposed between the base plate and the cover plate.

* * * * *